(12) United States Patent
Ji et al.

(10) Patent No.: US 12,211,827 B2
(45) Date of Patent: Jan. 28, 2025

(54) POWER SUPPLY SYSTEM AND POWER SUPPLY MODULE

(71) Applicant: Delta Electronics (Shanghai) Co., Ltd., Shanghai (CN)

(72) Inventors: Pengkai Ji, Shanghai (CN); Shouyu Hong, Shanghai (CN); Haoyi Ye, Shanghai (CN); Jianhong Zeng, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 18/531,711

(22) Filed: Dec. 7, 2023

(65) Prior Publication Data

US 2024/0105690 A1    Mar. 28, 2024

Related U.S. Application Data

(63) Continuation of application No. 18/171,686, filed on Feb. 21, 2023, now Pat. No. 11,876,084, which is a
(Continued)

(30) Foreign Application Priority Data

Jan. 8, 2020   (CN) ......................... 202010018822.8

(51) Int. Cl.
*H01L 25/10*   (2006.01)
*H01L 23/00*   (2006.01)
(Continued)

(52) U.S. Cl.
CPC ........ *H01L 25/105* (2013.01); *H01L 23/3121* (2013.01); *H01L 23/3672* (2013.01);
(Continued)

(58) Field of Classification Search
CPC ............... H01L 25/103; H01L 23/3121; H01L 23/3672; H01L 23/5381; H01L 23/562;
(Continued)

(56) References Cited

U.S. PATENT DOCUMENTS 5,798,567 A   8/1998  Kelly et al.
6,225,702 B1  5/2001  Nakamura
(Continued)

FOREIGN PATENT DOCUMENTS

CA   2647863 A1   7/2009
CN   101211792 A  7/2008
(Continued)

*Primary Examiner* — Peniel M Gumedzoe
(74) *Attorney, Agent, or Firm* — CKC & Partners Co., LLC

(57) ABSTRACT

A power supply system includes a system board electrically connected to a load; a first package and a second package provided on an upper side of the system board; and a bridge member provided on upper sides of the first package and the second package, comprising a passive element and used for power coupling between the first package and the second package, wherein vertical projections of the first package and the second package on the system board are both overlapped with a vertical projection of the bridge member on the system board, the first package, and the second package are encapsulated with switching devices, terminals on upper surfaces of the first package and the second package are electrically connected to the bridge member, and terminals on lower surfaces thereof are electrically connected to the system board.

26 Claims, 22 Drawing Sheets

Related U.S. Application Data continuation of application No. 17/102,393, filed on Nov. 23, 2020, now Pat. No. 11,621,254.

(51) Int. Cl.
- *H01L 23/31* (2006.01)
- *H01L 23/367* (2006.01)
- *H01L 23/538* (2006.01)
- *H01L 23/64* (2006.01)
- *H02M 3/158* (2006.01)
- *H02M 3/335* (2006.01)

(52) U.S. Cl.
CPC ........ *H01L 23/5381* (2013.01); *H01L 23/562* (2013.01); *H01L 23/642* (2013.01); *H01L 23/645* (2013.01); *H02M 3/1582* (2013.01); *H02M 3/33576* (2013.01)

(58) Field of Classification Search
CPC .. H01L 23/642; H01L 23/645; H02M 3/1582; H02M 3/33576
See application file for complete search history.

(56) References Cited

U.S. PATENT DOCUMENTS

| | | | |
|---|---|---|---|
| 6,346,679 B1 | 2/2002 | Nakamura | |
| 6,362,986 B1 | 3/2002 | Schultz et al. | |
| 6,479,758 B1 | 11/2002 | Arima et al. | |
| 6,740,965 B2 | 5/2004 | Hsu et al. | |
| 7,449,799 B2 | 11/2008 | Levin et al. | |
| 8,395,404 B2 | 3/2013 | Kaku | |
| 10,395,819 B2 | 8/2019 | Wukovits et al. | |
| 11,145,632 B2 * | 10/2021 | Dominguez | H01L 23/3128 |
| 2004/0027813 A1 | 2/2004 | Li | |
| 2005/0169033 A1 | 8/2005 | Sugita et al. | |
| 2005/0274982 A1 | 12/2005 | Ueda et al. | |
| 2006/0181857 A1 | 8/2006 | Belady et al. | |
| 2007/0045815 A1 | 3/2007 | Urashima et al. | |
| 2007/0188997 A1 | 8/2007 | Hockanson et al. | |
| 2009/0290316 A1 | 11/2009 | Kariya | |
| 2009/0296360 A1 | 12/2009 | Doblar et al. | |
| 2010/0258952 A1 | 10/2010 | Fjelstad | |
| 2011/0080717 A1 | 4/2011 | Koide et al. | |
| 2014/0133115 A1 | 5/2014 | Iguchi | |
| 2014/0334121 A1 | 11/2014 | Ito et al. | |
| 2015/0054611 A1 | 2/2015 | Cambronero Garcia | |
| 2015/0117862 A1 | 4/2015 | Trotta et al. | |
| 2016/0300659 A1 | 10/2016 | Zhang et al. | |
| 2016/0379952 A1 | 12/2016 | Cahill et al. | |
| 2017/0048963 A1 | 2/2017 | Murakami | |
| 2017/0069607 A1 | 3/2017 | Yap | |
| 2018/0032117 A1 | 2/2018 | Leigh et al. | |
| 2018/0076718 A1 | 3/2018 | Zeng et al. | |
| 2019/0074771 A1 | 3/2019 | Zeng et al. | |
| 2019/0254166 A1 | 8/2019 | Ji et al. | |
| 2019/0320554 A1 | 10/2019 | Nakajima et al. | |
| 2020/0211977 A1 | 7/2020 | Kim et al. | |

FOREIGN PATENT DOCUMENTS

| | | |
|---|---|---|
| CN | 103730434 A | 4/2014 |
| CN | 103871716 A | 6/2014 |
| CN | 104112727 A | 10/2014 |
| CN | 102576593 B | 12/2014 |
| CN | 105449987 A | 3/2016 |
| CN | 107026575 A | 8/2017 |
| CN | 107154385 A | 9/2017 |
| CN | 206726916 U | 12/2017 |
| CN | 107545974 A | 1/2018 |
| CN | 107799511 A | 3/2018 |
| CN | 108962556 A | 12/2018 |
| CN | 110112905 A | 8/2019 |
| IN | 201914054517 A | 7/2020 |
| IN | 202014000536 A | 7/2020 |
| JP | H097862 A | 1/1997 |
| JP | 2012124977 A | 6/2012 |
| JP | 2019079943 A | 5/2019 |

* cited by examiner

POWER SUPPLY SYSTEM AND POWER SUPPLY MODULE

CROSS-REFERENCE TO RELATED APPLICATIONS

This is a continuation application of the U.S. application Ser. No. 18/171,686 filed on Feb. 21, 2023, which is a continuation application of the U.S. application Ser. No. 17/102,393 filed on Nov. 23, 2020, the U.S. application Ser. No. 17/102,393 is based upon and claims priority to Chinese Patent Application No. 202010018822.8, filed on Jan. 8, 2020, and the entire contents thereof are incorporated herein by reference.

BACKGROUND

1. Technical Field

The invention relates to the technical field of power electronics, and in particular, to a power supply system with a bridge member for data center or intelligent IC.

2. Related Art

With more and more functions of various intelligent ICs, the power consumption is getting larger and devices on the main board also increase, which requires power modules having higher power density, or a single power module having a larger current output capability. In the existing horizontal power supply solution, the current is transmitted to the load via a customer board (or called "a system board"), but a current transmission path of such a power supply solution is long. In the existing vertical power supply solution, the current is transmitted to the power supply module via the customer board, and the current transmission path often passes through a signal terminal region of intelligent IC to easily interfere with the signal. Moreover, due to the influence of the signal terminal, the resistance of the current transmission path is relatively large. So the arrangement of such a power supply solution still needs to be improved. Furthermore, the existing power supply solutions do not facilitate improving efficiency and dynamic of the power module, and often occupy much space of the customer board or resource of the internal trace to easily interfere with signal traces on the customer board, and not convenient for customer application. Therefore, there are issues on how to improve the efficiency of the power supply system, reduce signal inference to the load chip, and improve the power density of the power supply system while occupying a smaller footprint of the customer board, so as to enable the power supply system to adapt to various load requirements quickly and flexibly at a relatively low cost.

SUMMARY

An object of the invention is to provide a power supply system capable of solving one or more deficiencies of the prior art.

To realize the above object, the invention provides a power supply system, comprising: a system board electrically connected to a load; a first package and a second package provided on an upper side of the system board; a bridge member provided on upper sides of the first package and the second package, comprising a passive element and used for power coupling between the first package and the second package; and a connector electrically connected to the bridge member for transmitting an external current to the first package, wherein vertical projections of the first package and the second package on the system board are both overlapped with a vertical projection of the bridge member on the system board, the first package comprises one or more switching devices encapsulated in the first package, and the second package comprises one or more switching devices encapsulated in the second package, terminals on upper surfaces of the first package and the second package are electrically connected to the bridge member, and terminals on lower surfaces thereof are electrically connected to the system board.

To realize the above object, the invention provides a power supply module, is configured to be applied to a power supply system, the power supply system further comprises a load and a system board electrically connected to the load, wherein the power supply module supply power to the load through the system board, the power supply module comprising: a first package and a second package; and a bridge member provided on upper sides of the first package and the second package, comprising a passive element and used for power coupling between the first package and the second package; and a connector electrically connected to the bridge member for transmitting an external current to the first package, wherein the first package and the second package are provided on an upper side of the system board, wherein vertical projections of the first package and the second package on the system board are both overlapped with a vertical projection of the bridge member on the system board, the first package comprises one or more switching devices encapsulated in the first package, and the second package comprises one or more switching devices encapsulated in the second package, terminals on upper surfaces of the first package and the second package are electrically connected to the bridge member, and terminals on lower surfaces thereof are electrically connected to the system board.

The power supply system according to some embodiments of the invention can balance a small footprint and a high efficiency, can meet a variety of requirements, and reduce types of packages, so as to reduce cost and improve flexibility. Moreover, as compared to the system board, the bridge member is easier to be optimized targeted, such that power supply efficiency can be improved.

In addition, the power supply system can also meet various application requirements by customizing the bridge member on the basis of the standard packages. Due to the customized optimization of the bridge member, the high efficiency of the system can be ensured. Moreover, the development cost or cycle for customizing the bridge member is typically far less than the development cost or cycle for developing the package, such that various application requirements can be quickly satisfied at a low cost.

Additional aspects and advantages of the invention are partially explained in the description below, and partially becoming apparent from the description, or can be obtained through the practice of the invention.

BRIEF DESCRIPTION OF THE DRAWINGS

The exemplary embodiments of the invention will be described in detail with reference to the accompanying drawings, through which the above and other objects, features, and advantages of the invention will become more apparent.

FIGS. 2C and 2D are structural diagrams of a power supply system implemented taking a buck circuit shown in FIG. 11A as an example, wherein FIG. 2C is a side view, and FIG. 2D is a sectional view along an A-A direction in FIG. 2C.

FIG. 2E is a side view, and FIG. 2F is a top view of FIG. 2E.

FIGS. 2G and 2H show a variation on the basis of the embodiment of FIGS. 2E and 2F, wherein FIG. 2G is a sectional view along a B-B direction in FIG. 2H, FIG. 2H is a top view of FIG. 2G and one winding of the bridge member penetrates through a through hole on another winding to cross with it.

DETAILED EMBODIMENTS

Figure 1A:
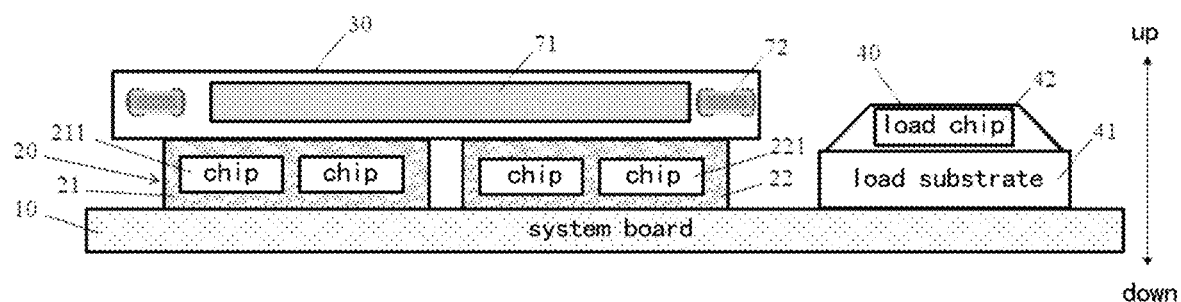
FIG. 1A is a structural diagram of a power supply system according to a first embodiment of the invention, wherein a first package, a second package, and a load are all provided on an upper surface of the system board.

Hereinafter the embodiments of the invention are described in detail, and the embodiments are exemplarily illustrated in the accompanying drawings, where the same or similar sign represents the same or similar element or element having the same or similar functionality throughout. Hereinafter the embodiments described with reference to the accompanying drawings are exemplary, and are aimed at explaining the invention, but shall not be understood as being limited to the invention.

In the invention, it shall be understood that the orientation or positional relationship indicated by the terms "up", "down", "front", "back", "left", "right", "vertical", "lateral", "top", "bottom", "in", "out", and the like is the orientation or positional relationship illustrated by the drawings, and is only for the purpose of describing the invention and simplifying the explanation, rather than indicating or suggesting that the referred devices or elements must have specific orientations, and be constructed and operated in specific orientations, so it cannot be understood as being limited to the invention.

In addition, the terms "first" and "second" are merely for description, but shall not be understood as indicating or suggesting relative importance or implicitly pointing out the number of the indicated technical features. Accordingly, the defined features with "first" and "second" can indicate or implicitly comprise at least one of the features. In the invention, the meaning of "a plurality of" is at least two, such as two, three, or the like, unless the context clearly defines otherwise.

In the invention, unless the context indicates and defines otherwise, the terms "mount", "link", "connect", "fix", and the like shall be understood in a broad sense. For example, it can be fixedly connected, also can be detachably connected, or form as an integrated part; it can be directly connected, also can be indirectly connected through an intermediate medium, and can be communicated inside two elements, or interaction relationship of two elements, unless the context clearly defines otherwise. For those ordinary in the art, the specific meanings of the above terms in the invention can be understood according to specific conditions.

In the present invention, the reference term "one embodiment", "some embodiments", "example", "specific example", or "some examples" intends to be included in at least one embodiment or example of the invention combining with the specific feature, structure, material or characteristic described by the embodiment or example. In the present invention, the exemplary expression of the above terms does not necessarily refer to the same embodiment or example. Moreover, the described specific feature, structure, material, or characteristic can be combined in a suitable way in any one or more embodiments or examples. In addition, those skilled in the art can combine and group different embodiments or examples, and features in different embodiments or examples described in the present invention without contradiction.

FIG. 1A illustrates a structural diagram of a power supply system according to a first embodiment of the invention. The power supply system comprises a system board 10, at least two packages 20, and a bridge member 30. The system board 10 is electrically connected to a load 40. In this embodiment, there may be, for example, two packages 20, such as a first package 21 and a second package 22. These packages 20 are provided on an upper side of the system board 10. The bridge member 30 is provided on the upper sides of the first package 21 and the second package 22, and vertical projections of the first package 21 and the second package 22 on the system board 10 are both overlapped with a vertical projection of the bridge member 30 on the system board 10. That is, the system board 10, the packages 20, and the bridge member 30 are stacked in order. The load 40 may comprise a load substrate 41 and a load chip 42, for example, wherein the load substrate 41 may be stacked on an upper surface of the system board 10, and the load chip 42 may be stacked on the load substrate 41.

In the embodiment, the first package 21 and the second package 22 are encapsulated with switching devices, which may be connected to form different power circuits, including but not limited to a half-bridge circuit, a full-bridge circuit, and the like. These power circuits may be integrated into one or more chips and encapsulated within the packages 20. For example, in FIG. 1A, the first package 21 is encapsulated with two chips 211, and the second package 22 is encapsulated with two chips 221. The bridge member 30 may comprise a passive element, including but not limited to an inductor 71 and a capacitor 72, and the bridge member 30 may be configured for power coupling between the first package 21 and the second package 22, such as current transmission or magnetic field coupling. In the embodiment, the first package 21 and the second package 22 may be electrically connected to the bridge member 30 through terminals on upper surfaces, and electrically connected to the system board 10 through terminals on lower surfaces. That is, the first package 21 and the second package 22 may be a structure having pads on upper and lower surfaces. It should be understood that in other embodiments, the number of the packages 20 may be plural, such as three or more, and these packages 20 may be a structure having pads on a single surface, but the invention is not limited thereto.

In the embodiment of FIG. 1A, the load 40 and the packages 20 (comprising the first package 21 and the second package 22) may be provided on the same side of the system board 10, such as, above the upper surface of the system board 10.

Figure 1B:
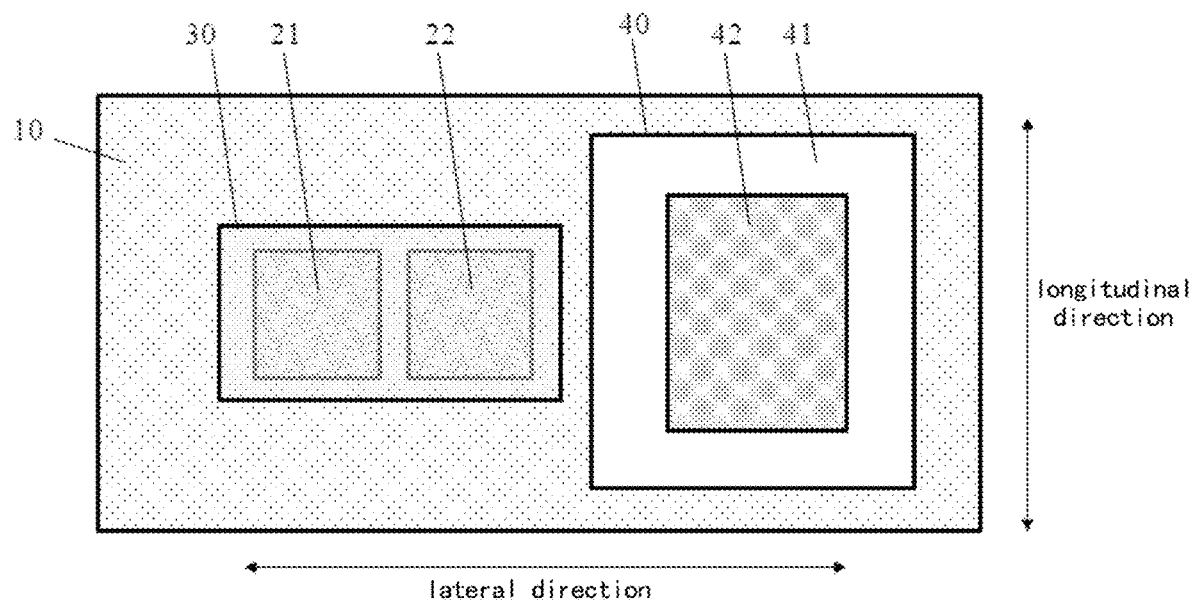
FIG. 1B is a top view of the power supply system of FIG. 1A, wherein the first package and the second package are arranged along a lateral direction, and an entirety thereof is arranged with the load along the lateral direction.

FIG. 1B is a top view of FIG. 1A, illustrating that the first package 21 and the second package 22 may be arranged along a lateral direction, and an entirety thereof is arranged with the load 40 along the lateral direction. Such an arrangement is suitable for a two-stage power supply solution of the first package 21 and the second package 22. For example, the load 40 may be powered through the first package 21 as a first stage and the second package 22 as a second stage.

Figure 1C:
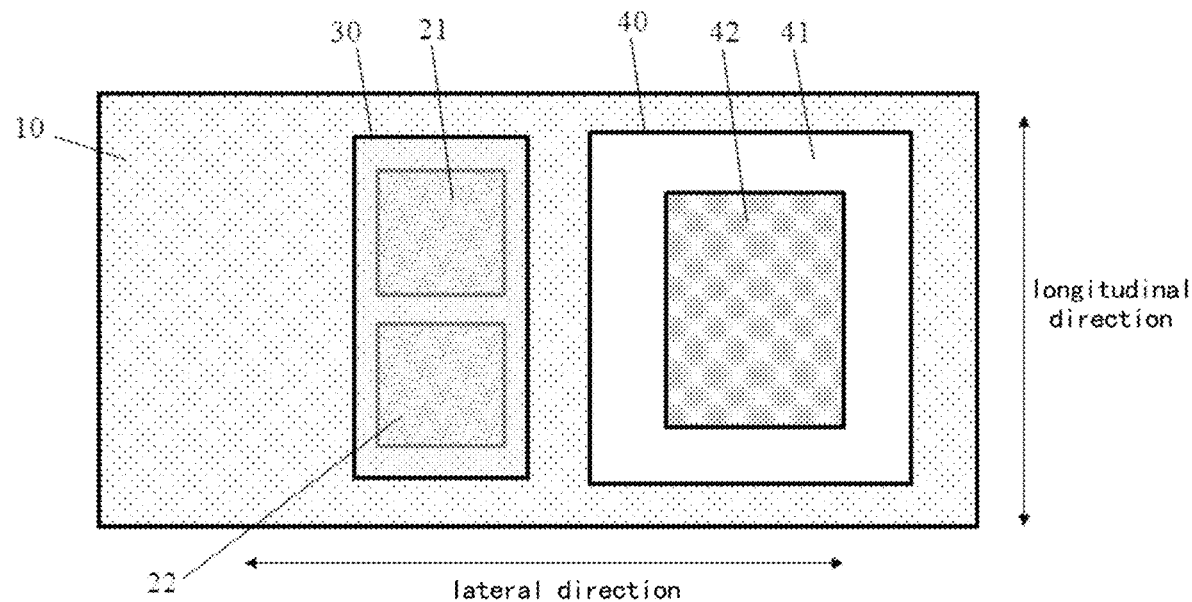
FIG. 1C is a variation on the basis of FIG. 1B, wherein the first package and the second package are arranged along a longitudinal direction, and an entirety thereof is arranged with the load along the lateral direction.

FIG. 1C is a variation on the basis of FIG. 1B, illustrating that the first package 21 and the second package 22 may be arranged along a longitudinal direction, and an entirety thereof is arranged with the load 40 along the lateral direction. As compared to FIG. 1B, a relative position between the load 40 and entirety of the first package 21, the second package 22, and the bridge member 30 in FIG. 1C rotates 90 degrees with respect to a position thereof in FIG. 1B, such that the first package 21 and the second package 22 are as close to the load 40 as possible. Such an arrangement is suitable for a solution where the first package 21 and the second package 22 supply power directly to the load 40. For example, the first package 21 and the second package 22 work in parallel.

Figure 1D:
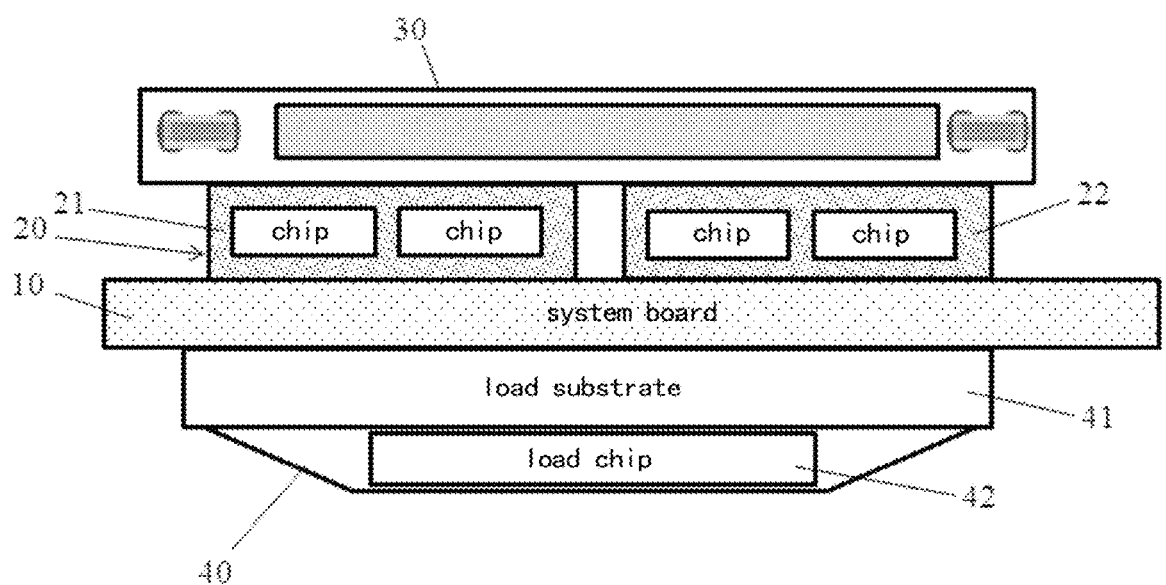
FIG. 1D is another variation of the embodiment of FIG. 1A, wherein the first package and the second package are provided on the upper surface of the system board, and the load is provided on a lower surface of the system board.

FIG. 1D is another variation of the embodiment of FIG. 1A, illustrating that the load 40 and the packages 20 (comprising the first package 21 and the second package 22) may be provided on opposite sides of the system board 10. For example, the first package 21 and the second package 22 may be provided on an upper surface of the system board 10, and the load 40 is provided on a lower surface of the system board 10. In some embodiments, vertical projections of the packages 20 and the load 40 on the system board 10 also can be overlapped. That is, the load 40, the system board 10, and the packages 20 are stacked in order to realize a shorter current transmission path, and facilitate improving efficiency and dynamic performance. For example, a vertical projection of the second package 22 on the system board 10 may be overlapped with a vertical projection of the load 40 on the system board 10, or vertical projections of the first package 21 and the second package 22 on the system board 10 may also be both overlapped with a vertical projection of the load 40 on the system board 10.

It should be noted that in the embodiment, each of the packages 20 can supply power independently. That is, each package 20 can realize the conversion of electrical energy without cooperating with another package 20. The two packages 20 realize power coupling through the bridge member 30, wherein power coupling comprises electrical coupling and magnetic coupling. Electrical coupling may be current transmission between the two packages 20, and magnetic coupling may be a coupling of magnetic paths between the two packages 20.

Such an arrangement can obtain the following advantages: the power supply system can provide both a small footprint and a high efficiency, and also can meet a variety of requirements, reduce types of packages, and facilitate reducing cost and improving flexibility. With respect to the system board 10, the bridge member 30 is easier to perform targeted optimization. For example, power supply efficiency is improved by the way of increasing a copper thickness or embedding a leadframe in the bridge member 30. Moreover, since the bridge member 30 includes a passive element, it is possible to make full use of a process gap or a suitable "flying out" portion between packages, thereby increasing an effective volume of the passive element. Since a space between the plurality of packages 20 is utilized, a volume of the bridge member 30 can be increased without additionally occupying a surface area of the system board, such that more passive elements are integrated within the bridge member 30. In particular, when the passive element is an energy storage member (such as an inductor or capacitor), an effective volume of the energy storage member can be improved, and system efficiency is improved without increasing the footprint of the system board 10. For example, in actual application, at least two packages 20 may be provided on the system board 10 (the circuit board) firstly, and then the bridge member 30 is provided on the packages 20. The packages 20 may be standard components, on the basis of which, various application requirements can be satisfied by customizing the bridge member 30. Due to the customized optimization of the bridge member 30, the high efficiency of the power supply system can be ensured. Moreover, the development cost or cycle of customizing the bridge member 30 is often far less than that of developing the packages 20, so that various application requirements can be satisfied quickly at low cost.

Figure 2A:
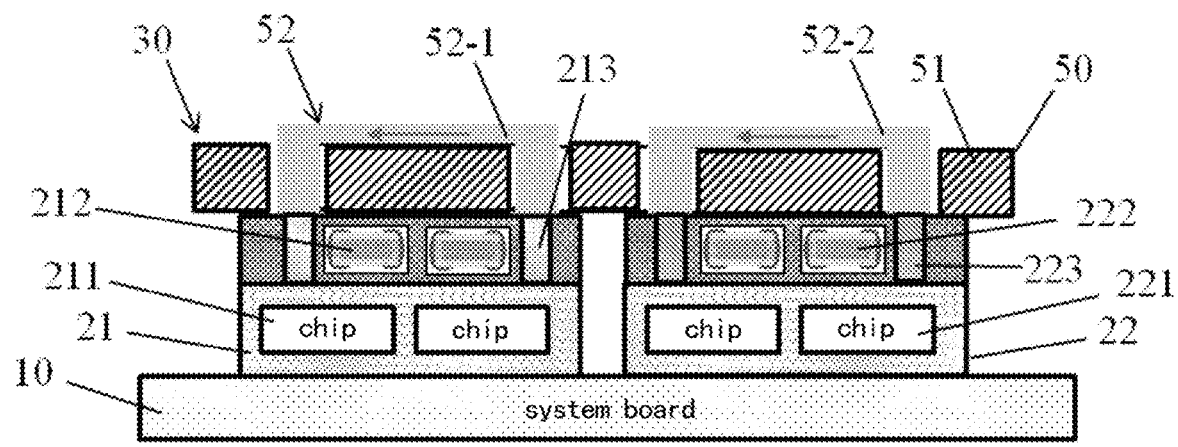
FIG. 2A is a structural diagram of a power supply system according to a second embodiment of the invention, wherein a multi-phase integrated inductor functions as a bridge member.

FIG. 2A is a structural diagram of a power supply system according to a second embodiment of the invention, wherein a multi-phase integrated inductor 50 (integrated inductors such as a multi-phase coupled inductor, a multi-phase inverse coupling inductor, a two-phase inverse coupling inductor, a four-phase inverse coupling inductor, and the like mentioned hereinafter are all referred to with the same sign "50") functions as a bridge member 30, and may comprise a magnetic core 51 and a plurality of windings 52. In this embodiment, each of the packages 20 may include at least a one-phase half-bridge circuit or two-phase half-bridge circuit, and the bridge member 30 may include the multi-phase inverse coupling inductor 50 (for a specific structure, please refer to FIGS. 3A-3G), thereby forming a multi-phase parallel buck circuit (such as FIG. 11A). Taking a circuit topology structure shown in FIG. 11A as an example, the first package 21 and the second package 22 in FIG. 2A may both include a two-phase parallel half-bridge circuit. Taking the first package 21 as an example, the first package 21 may include two chips 211, each of which may be integrated with a one-phase half-bridge circuit, and when the two chips 211 are connected in parallel, the first package 21 may form a two-phase parallel half-bridge circuit. When the SW terminal (i.e., intermediate node) of each half-bridge circuit is electrically connected to one end of one windings 52 of the multi-phase inverse coupling inductor 50, a power supply system with a multi-phase parallel buck circuit is formed. Moreover, an input capacitor $C_{in}$ and/or an output capacitor $C_o$, or other peripheral devices can also be provided within the packages. For example, as shown in FIG. 2A, the first package 21 can be provided with a capacitor 212 and a conductive connecting component 213. The capacitor 212 may be stacked above the chips 211 (including a plurality of switching devices), and function as the input capacitor $C_{in}$ and the output capacitor $C_o$ of the half-bridge circuit. The conductive connecting component 213 may be a copper block or a conductive through-hole, with one end electrically connected to an intermediate node (i.e., SW terminal) of the half-bridge circuit, and the other end electrically connected to the corresponding windings 52, such as the winding 52-1, of the multi-phase inverse coupling inductor 50. Similarly, the second package 22 may be provided with a capacitor 222 and a conductive connecting component 223, correspondingly. The capacitor 222 may be stacked above the chips 221 (including a plurality of switching devices), and function as the input capacitor $C_{in}$ and the output capacitor $C_o$ of the half-bridge circuit. The conductive connecting component 223 has one end electrically connected to an intermediate node (i.e., SW terminal) of the half-bridge circuit, and the other end electrically connected to the corresponding winding 52-2 of the multi-phase inverse coupling inductor 50. In other embodiments, the capacitor and the conductive connecting component (such as a copper block) may also be provided on upper surfaces of the first package 21 and the second package 22, as shown in FIG. 2C.

In other embodiment, the bridge member 30 in the embodiment of FIG. 2A may use a four-phase inverse coupling inductor shown in FIGS. 3A-3F, such that a four-phase buck circuit can be realized, so as to realize an inverse coupling parallel connection of the four-phase buck circuit, for example.

In the embodiment, the multi-phase inverse coupling inductor 50 can realize large inductance in a steady state and reduction of inductance through inverse coupling in a dynamic state, such that efficiency and dynamic performance of the power supply system can be better balanced. In addition, by making use of a process gap of a Surface Mount Technology (SMT) of the first package 21 and the second package 22, or a "flying out" portion along the first package 21 and the second package 22 (for example, both ends of the multi-phase inverse coupling inductor 50 in FIG. 2A partially "fly out" to outer sides of the first package 21 and the second package 22), a volume of the magnetic element can be increased without changing a footprint of the system board 10 occupied by the power supply system, or efficiency and saturation current of the inductor can be further improved by magnetic integration and magnetic path sharing. The embodiment can realize a multi-phase inverse coupling power supply system by using the multi-phase inverse coupling inductor shown in FIGS. 3A-3G as the bridge member 30. The invention may realize a stable and reliable structure through abutment of the at least two packages 20 and the bridge member 30.

Figure 2B:
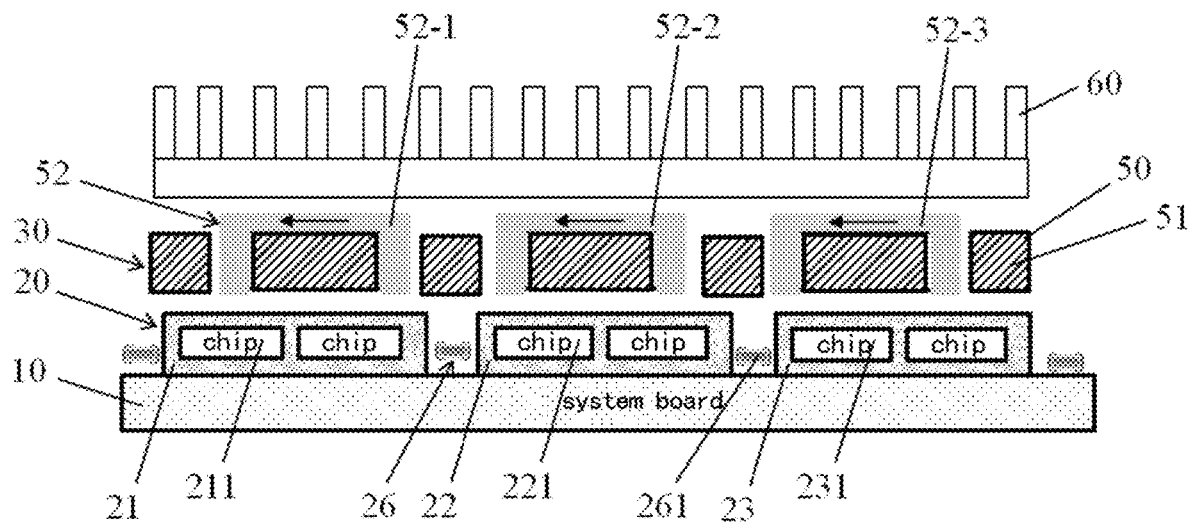
FIG. 2B is a variation on the basis of the embodiment of FIG. 2A, wherein three packages are used, and the bridge member is also stacked with a heat sink.
Figure 2C:
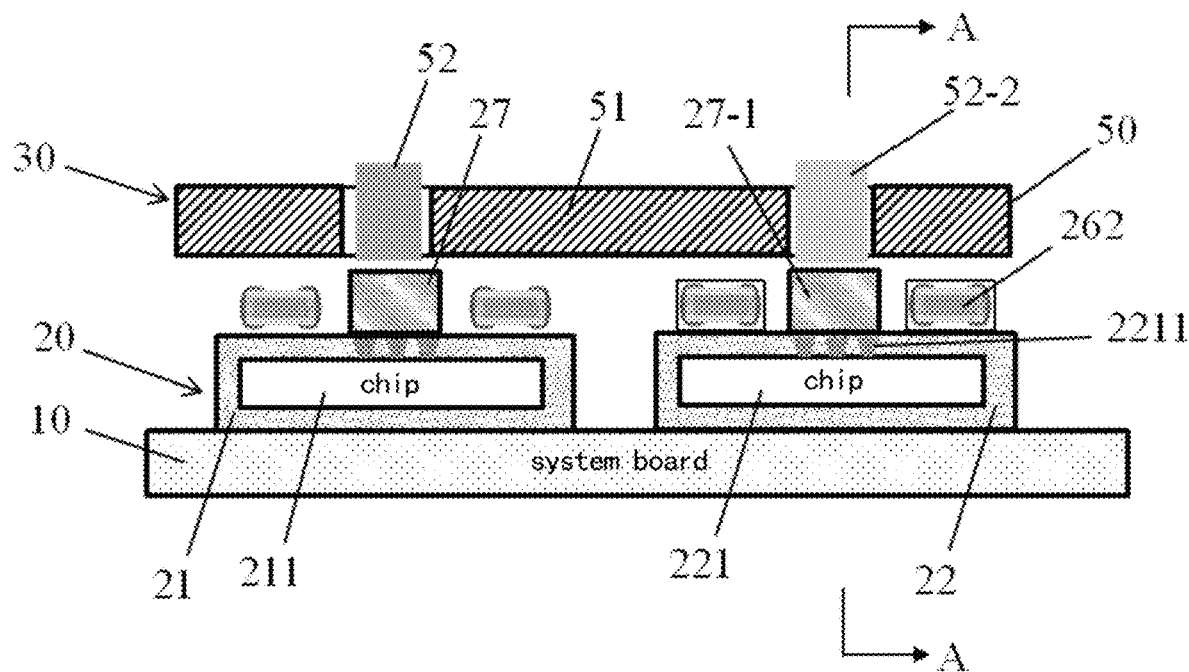

FIG. 2B illustrates that three packages 20 may be used on the basis of FIG. 2A and each of the packages 20 may be directly electrically connected to the windings 52 of the multi-phase inverse coupling inductor 50. For example, the first package 21, the second package 22, and a third package 23 may be directly electrically connected to corresponding windings 52-1, 52-2, and 52-3, respectively. In other embodiments, each of the packages 20 may include a two-phase half-bridge circuit, such that a six-phase buck parallel circuit can be formed, and a power supply system with a larger power can be realized.

In the embodiment shown in FIG. 2A, the capacitors 212, 222, and the conductive connecting components 213, 223 are provided in the packages, and stack with the chips 211 and 221 to reduce a footprint. For example, the capacitors 212 and 222 may function as an input capacitor $C_{in}$ of the circuit topology in FIG. 11A, and the conductive connecting components 213 and 223 may be used to connect the intermediate node SW of the half-bridge circuit below them to one end of the windings 52 of the multi-phase inverse coupling inductor 50 above them. The embodiment of FIG. 2B illustrates that the multi-phase inverse coupling inductor 50 (i.e., the bridge member 30) is connected to chips 211, 221, 231 within the packages 20 below it more directly, i.e., without conductive connecting components, such as capacitors or copper blocks therebetween. The embodiment of FIG. 2B also illustrates that a heat sink 60 and the bridge member 30 (the multi-phase inverse coupling inductor 50) may be integrally designed, which can enhance heat dissipation and facilitate customer application. In addition, FIG. 2B also illustrates other devices 26 can be provided between the packages 20. For example, a capacitor 261 (functioning as an input capacitor or an output capacitor) or peripheral devices of the chips may be provided on the system board 10 to make full use of the space between the packages 20 on the system board 10, thereby improving the power density of the power supply system, or improving flexibility of the packages 20 for power supply solutions in various applications.

It should be noted that the embodiment shown in FIG. 2A is explained by taking a buck circuit as an example, but the embodiment may use other circuits, such as various circuit topologies in FIG. 11A, 11B, 11C or 11D, or other possible circuit topologies of the multi-phase inverse coupling inductor. The invention is not limited thereto. The bridge member 30 in the embodiment shown in FIGS. 2A and 2B may be an inverse coupling inductor in various forms. The invention gives some embodiments in FIGS. 3A-3G, which will be described in detail later.

Figure 2D:
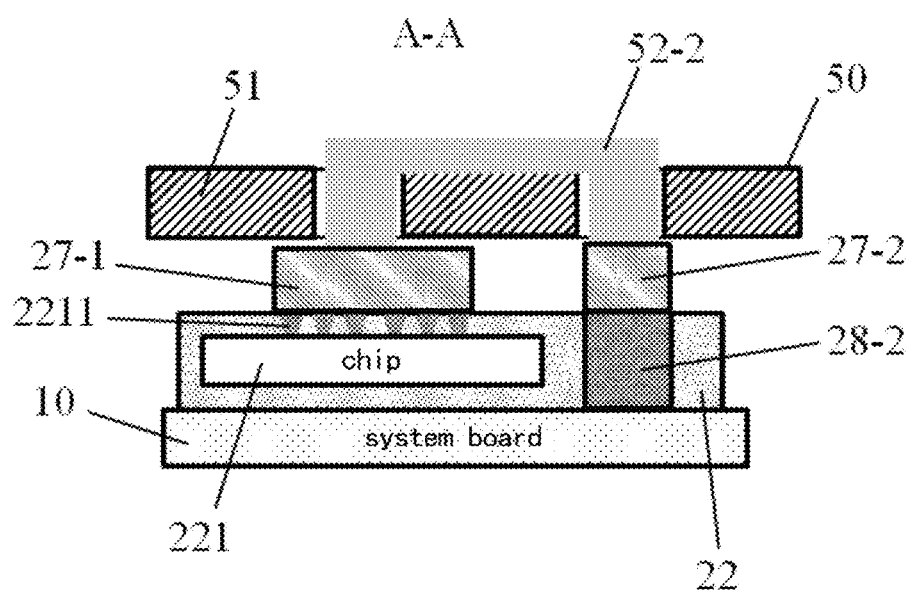
Figure 11A:
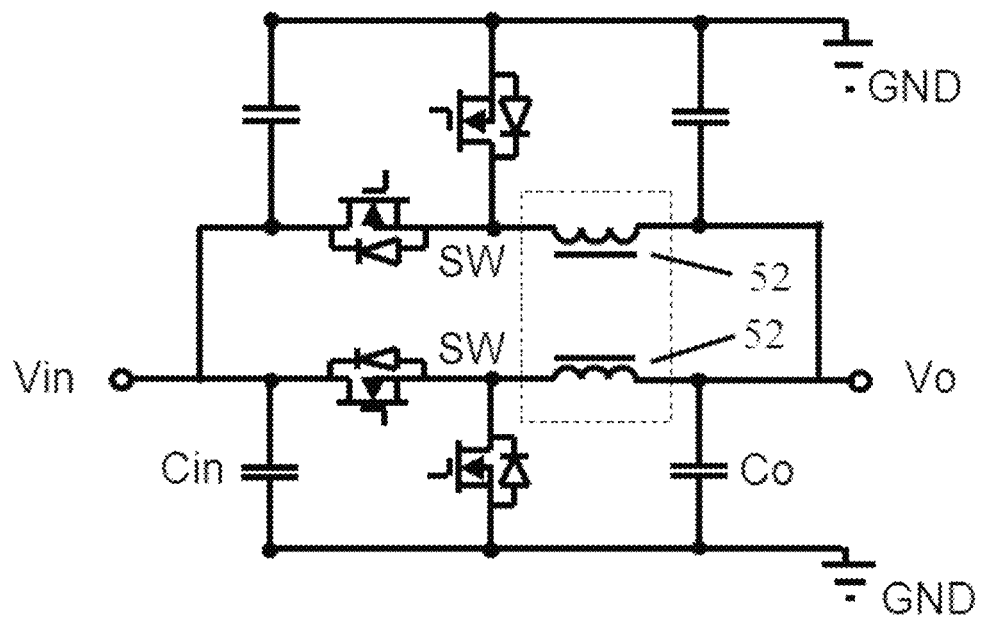
FIG. 11A illustrates a structure of a buck circuit adapted to the invention.

FIGS. 2C and 2D are structural diagrams of a power supply system implemented taking a buck circuit shown in FIG. 11A as an example, wherein FIG. 2C is a side view, and FIG. 2D is a sectional view along an A-A direction in FIG. 2C. The chip 211 of the first package 21 and the chip 221 in the second package 22 in FIG. 2C may be integrated with half-bridge circuits. For example, each of the packages 20 may comprise one chip 211/221, each chip 211/221 comprising one half-bridge circuit, and a terminal side of the chip 211/221 may face up. Moreover, SW terminals 2211 may be provided above the chip 211/221, such that a copper block 27 is connected to the SW terminals 2211, and the bridge member 30 may be a two-phase integrated inductor 50. Of course, it should be understood that if the plurality of packages 20 or each package 20 has one or more half-bridge circuits therein, the bridge member 30 may also be a coupled inductor or inverse coupling inductor with two or more phases, and terminals of the windings 52 of the bridge member 30 are connected to the copper block 27. As shown in FIG. 2D, one end of the winding 52-2 is connected to the SW terminals 2211 through a copper block 27-1, and the other end of the winding 52-2 is connected to a copper block 27-2, to the bottom of the package 22 through a conductive through-hole 28-2 (which may also be an embedded copper block), and then to the system board 10. The copper block 27-1 may form a conductive connecting component with one end electrically connected to an intermediate node of the half-bridge circuit, and the other end electrically connected to the windings of the inductor. Similarly, the conductive through-hole 28-2 between the copper block 27-2 and the chip may also form a conductive connecting component with one end electrically connected to another of the windings, and the other end electrically connected to the system board 10. In such a way, the first package 21 and the second package 22 may be provided on the system board 10 and may realize magnetic coupling through abutment of the bridge member 30. Such a structure may form at least a two-phase parallel buck circuit, is compact, and can be flexibly adapted for various customer requirements. As shown in FIGS. 2C and 2D, in this embodiment a capacitor 262 and conductive connecting components such as copper blocks 27, 27-1, and 27-2 in the circuit topology may be arranged on the upper surfaces of the first package 21 and the second package 22.

Figure 2E:
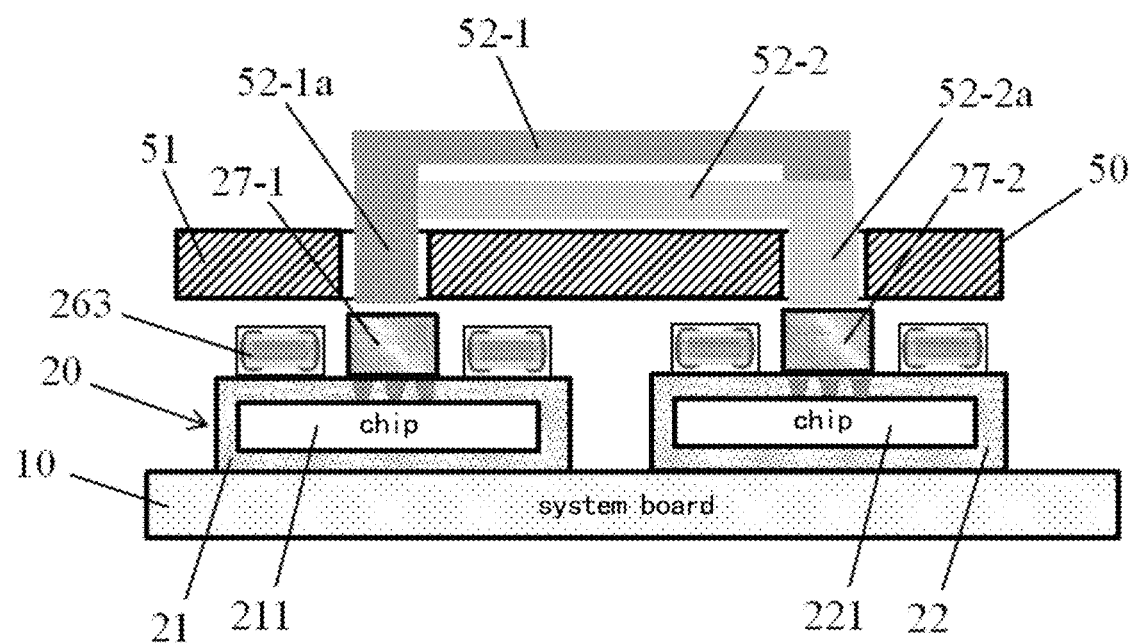
FIGS. 2E and 2F show a variation on the basis of the embodiment of FIGS. 2C and 2D, wherein two windings of the bridge member cross and form an inverse coupling circuit.
Figure 2F:
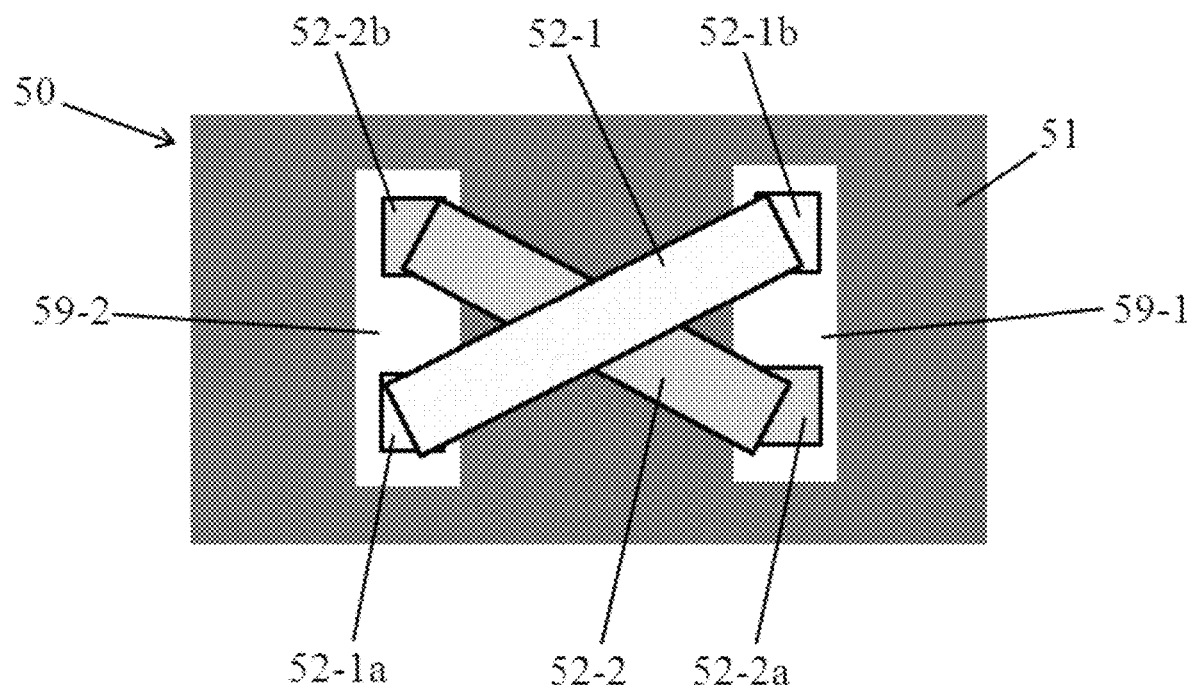

FIGS. 2E and 2F show a variation on the basis of the embodiment shown in FIGS. 2C and 2D, wherein FIG. 2E is a side view, and FIG. 2F is a top view of FIG. 2E. In the embodiment of FIGS. 2E and 2F, two windings 52-1 and 52-2 of the bridge member 30 cross each other, and form an inverse coupling circuit. For example, the windings 52-1 and 52-2 may be stacked up and down, and cross each other, such that inverse coupling between two phases is realized. That is, a two-phase inverse coupling inductor 50 having a magnetic core 51 and two windings 52-1 and 52-2 is formed, with the magnetic core 51 having windows 59-1 and 59-2. One end of the winding 52-2 of the two-phase inverse coupling inductor 50 is connected to a vertical winding portion 52-2a in the window 59-1, and connected to SW terminals of the chip 221 in the second package 22 through the copper block 27-2, and the other end of the winding 52-2 is connected to a vertical winding portion 52-2b in the window 59-2, to a bottom of the first package 21 through a conductive through-hole (or an embedded copper block) in the first package 21, and then to the system board 10. Similarly, one end of the winding 52-1 of the two-phase inverse coupling inductor 50 is connected to a vertical winding portion 52-1a in the window 59-2, and connected to the SW terminals of the chip 211 in the first package 21 through the copper block 27-1, and the other end of the winding 52-1 is connected to a vertical winding portion 52-1b in the window 59-1, to a bottom of the second package 22 through a conductive through-hole (or an embedded copper block) in the second package 22, and then to the system board 10. Such a structure can realize a two-phase inverse coupling buck circuit and is compact with the flexible application. As shown in FIGS. 2E and 2F, this embodiment can also provide a capacitor 263 in the circuit topology and conductive connecting components such as copper blocks 27-1 and 27-2 on the upper surfaces of the first package 21 and the second package 22.

Figure 2G:
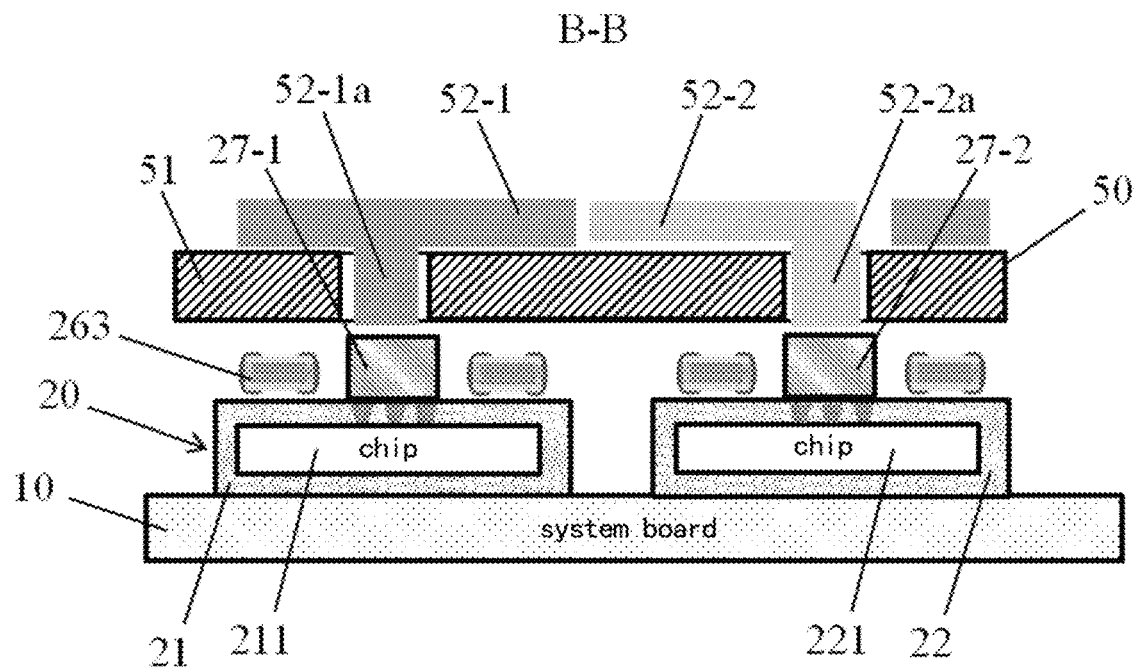
Figure 2H:
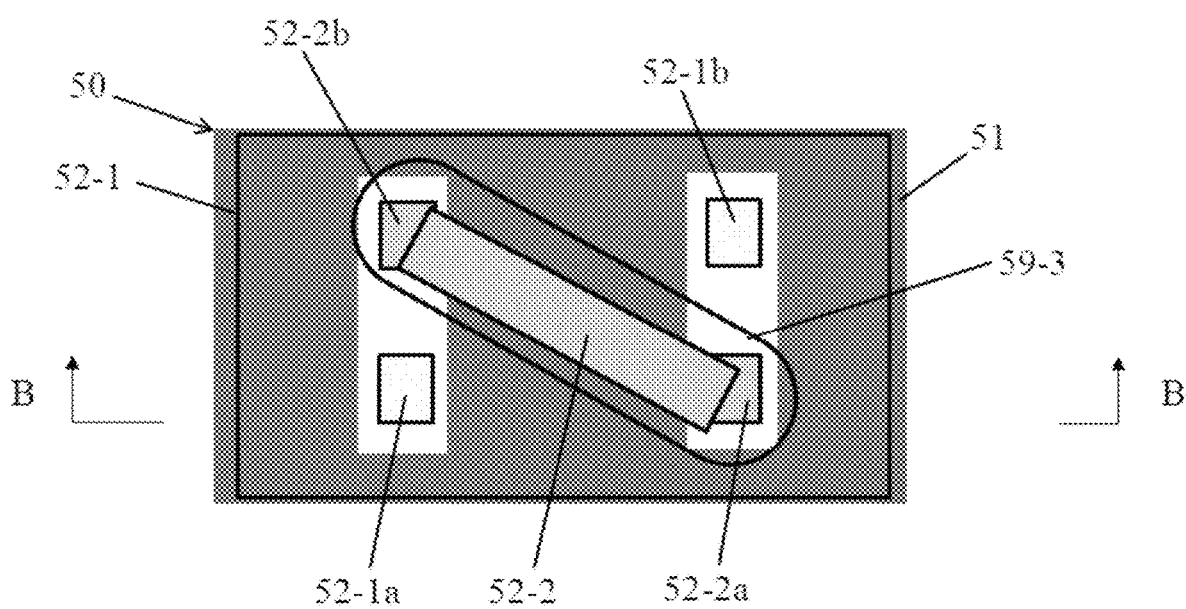

FIGS. 2G and 2H show a variation on the basis of the embodiment shown in FIGS. 2E and 2F, wherein FIG. 2G is a sectional view along a B-B direction in FIG. 2H, and FIG. 2H is a top view of FIG. 2G. The embodiment shown in FIGS. 2G and 2H differs from the embodiment shown in FIGS. 2E and 2F mainly in that the winding 52-1 is a flat plate having a through hole 59-3 in the center to avoid the winding 52-2, such that the winding 52-1 crosses the winding 52-2. Such a structure may not stack the windings 52-1 and 52-2 as shown in FIG. 2E, so that the height is reduced, and the manufacturing and assembling process is simplified. In addition, solder balls may also be pre-fabricated above the copper block 27-1 or 27-2 to solder the bridge member 30 (i.e., the two-phase inverse coupling inductor 50), or solder balls may also be pre-fabricated on a lower surface of the windings (i.e., a terminal surface of the windings) of the bridge member 30 to facilitate soldering the windings onto the packages. Generally, in the embodiments shown in FIGS. 2C-2H, if each of the packages is encapsulated only with one chip, and each chip has at least one half-bridge circuit, then multi-phase buck circuits can be connected in parallel to realize a greater output current. Meanwhile, since each of the packages is encapsulated only with one chip to improve the yield of the system and reduce cost, it is also possible to place the packages on the system board 10 more flexibly and realize various power supply combinations to have better flexibility by customizing the bridge member 30. As shown in FIGS. 2G and 2H, this embodiment also can provide the capacitor 263 in the circuit topology and the conductive connecting components such as the copper blocks 27-1 and 27-2 on the upper surfaces of the first package 21 and the second package 22. In some embodiments, the copper block 27-1 may be omitted, and the SW terminals of the chip 211 may be directly electrically connected to the winding 52-1. It is similar for the copper 27-2, such that an overall height can be reduced.

Figure 3A:
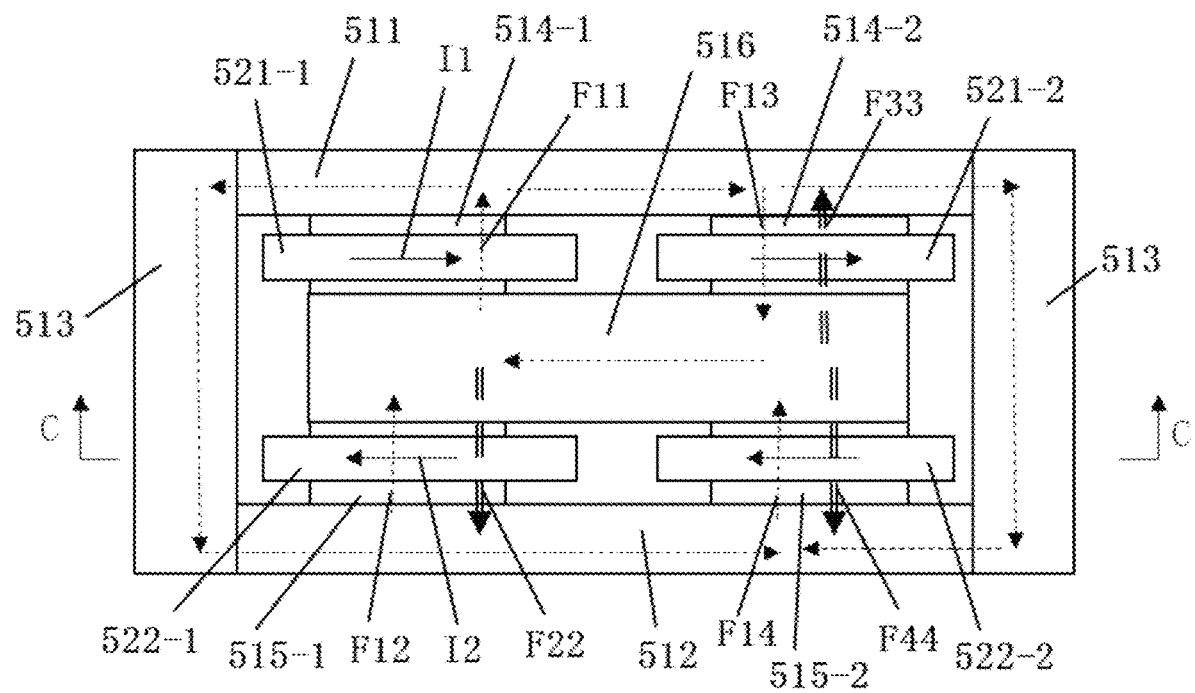
FIG. 3A is a top view where the bridge member in the embodiment of FIG. 2A is a multi-phase inverse coupling inductor.
Figure 3B:
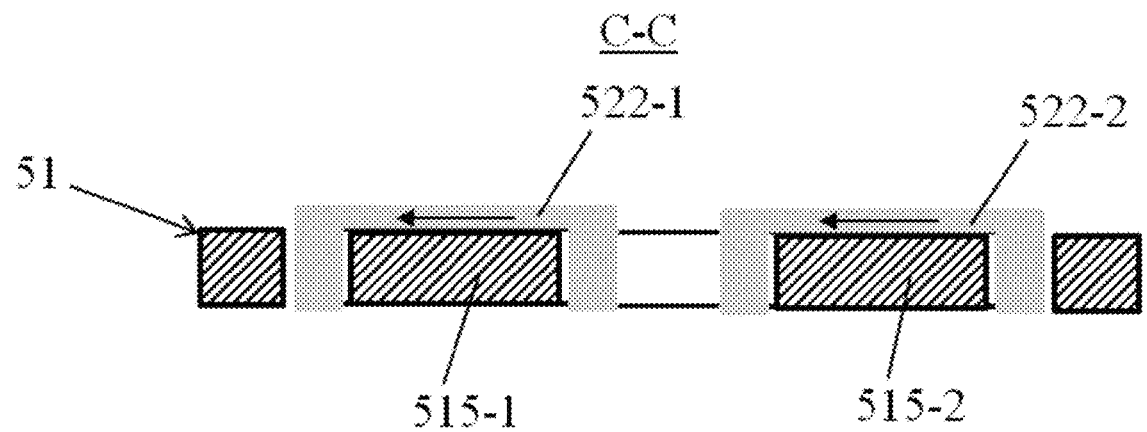
FIG. 3B is a sectional view along a C-C direction in FIG. 3A.

FIG. 3A illustrates an embodiment in which the bridge member 30 is a multi-phase inverse coupling inductor 50. FIG. 3A is a top view, and FIG. 3B is a sectional view along the C-C direction of FIG. 3A. As shown in FIGS. 3A and 3B, the multi-phase inverse coupling inductor 50 in this embodiment is a four-phase inverse coupling inductor comprising a magnetic core 51 and four windings. The magnetic core 51 comprises a first lateral side column 511 and a second lateral side column 512 opposite to each other, at least one longitudinal side column 513 connected to the first lateral side column 511 and the second lateral side column 512, and two first longitudinal middle columns (514-1, 514-2) and two second longitudinal middle columns (515-1, 515-2) between the first lateral side column 511 and the second lateral side column 512. There may be at least one, preferably two longitudinal side column 513, which are symmetrically arranged on the left and right sides in FIG. 3A, such that symmetry of the entire magnetic path can be improved. First ends of the first longitudinal middle columns 514-1 and 514-2 are connected to the first lateral side column 511, second ends of the first longitudinal middle columns 514-1 and 514-2 are connected to the first ends of the second longitudinal middle columns 515-1 and 515-2 (such as connected through a lateral middle column 516), and second ends of the second longitudinal middle columns 515-1 and 515-2 are connected to the second lateral side column 512. The four windings comprise first windings 521-1 and 521-2 provided on the first longitudinal middle columns 514-1 and 514-2, and second windings 522-1 and 522-2 provided on the second longitudinal middle columns 515-1 and 515-2, wherein a magnetic flux generated by a current flowing through any one of the windings and a magnetic flux generated by currents flowing through the remaining windings are at least partially counteract on the longitudinal middle columns wound by the windings, i.e., the respective windings are in inverse coupling relationships. Specifically, as shown in FIG. 3A, a DC magnetic flux generated by a current I1 flowing through the first windings 521-1 is shown by a dashed arrow. F11 illustrates a direction of the DC magnetic flux generated by the current I1 flowing through the first windings 521-1 in the first longitudinal middle column 514-1, F12 illustrates a direction of the DC magnetic flux generated by the current I1 flowing through the first windings 521-1 in the second longitudinal middle column 515-1, F22 illustrates a direction of the DC magnetic flux generated by a current I2 flowing through the second windings 522-1 in the second longitudinal middle column 515-1, and directions of F12 and F22 are opposite with each other. An inductor formed of the first windings 521-1 and the first longitudinal middle column 514-1 and an inductor formed of the second windings 522-1 and the second longitudinal middle column 515-1 are in an inverse coupling relationship, i.e., forming an inverse coupling inductor. Similarly, F13 illustrates a direction of the DC magnetic flux generated by the current I1 flowing through the first windings 521-1 in the first longitudinal middle column 514-2, F33 illustrates a direction of the DC magnetic flux generated by a current flowing through the first windings 521-2 in the first longitudinal middle column 514-2, and directions of F13 and F33 are opposite with each other. An inductor formed of the first windings 521-1 and the first longitudinal middle column 514-1 and an inductor formed of the first windings 521-2 and the first longitudinal middle column 514-2 are in an inverse coupling relationship, i.e., forming an inverse coupling inductor. Similarly, F14 illustrates a direction of the DC magnetic flux generated by the current I1 flowing through the first windings 521-1 in the second longitudinal middle column 515-2, F44 illustrates a direction of the DC magnetic flux generated by a current flowing through the second windings 522-2 in the second longitudinal middle column 515-2, and directions of F14 and F44 are opposite with each other. An inductor formed of the first windings 521-1 and the first longitudinal middle column 514-1 and an inductor formed of the second windings 522-2 and the second longitudinal middle column 515-2 are in an inverse coupling relationship, i.e., forming an inverse coupling inductor. Therefore, the first longitudinal middle column 514-1 form inverse coupling inductors with each of the other three longitudinal middle columns (514-2, 515-1, and 515-2). Positional relationships between the first longitudinal middle column 514-1 and the other three longitudinal middle columns (514-2, 515-1, and 515-2) have symmetry, and any one of the four longitudinal middle columns forms inverse coupling inductors with the other three longitudinal middle columns. That is, a magnetic flux direction of a DC magnetic flux generated by a current flowing through any one of the windings in a longitudinal middle column corresponding to other windings is opposite to a magnetic flux direction of a DC magnetic flux generated by a current flowing through the other windings in the corresponding longitudinal middle columns.

In this embodiment, as can be seen from FIG. 3B, the second windings 522-1 and 522-2 are fitted onto the second longitudinal middle columns 515-1 and 515-2 respectively, below which terminals of the second windings 522-1 and 522-2 are led out, such that assembly of the second windings 522-1 and 522-2 and the magnetic core 51 can be relatively simple. Moreover, since the second windings 522-1 and 522-2 are vertically arranged, it also facilitates heat dissipation in a vertical direction. The assembling method of the first windings 521-1 and 521-2 is similar to that of the second windings 522-1 and 522-2, so the details are not described herein.

In this embodiment, the two longitudinal side columns 513 of the magnetic core 51 are respectively arranged on left and rights sides, which facilitates improving consistency of lengths of the coupled magnetic paths between respective phases, and realizing uniformity and consistency of coupling level and inductance between respective phases. Of course, in other embodiments, the number of the first longitudinal middle columns 514 and the second longitudinal middle columns 515 is not limited to the number shown in FIG. 3A. i.e., there may be at least one first longitudinal middle columns 514 and second longitudinal middle columns 515, and there may be only one longitudinal side column 513, i.e., on the left or right side; or the lateral middle column 516 may be omitted, but the invention is not limited thereto.

To sum up, the multi-phase inverse coupling inductor in the embodiment can realize the arrangement of respective windings in an array, can realize multi-phase inverse coupling and can realize uniformity and consistency of coupling strength and inductance between respective phases so as to improve efficiency. Arrangement of respective windings in an array can reduce a footprint, and facilitate improving the power density of the inductor. Moreover, due to the simple structure of the windings and the magnetic core, the multi-phase inverse coupling inductor in the embodiment has the advantages of a simple structure and good manufacturability. In addition, it should be understood that the magnetic core of the multi-phase inverse coupling inductor in the embodiment is suitable for a ferrite material as well as a powder core material, can be manufactured in various ways, and is suitable for various flexible applications. Furthermore, the multi-phase inverse coupling inductor of the present embodiment may be in an array structure with the windings arranged vertically to enable currents in windings of respective phases to be more uniform, and simple pins to facilitate heat dissipation in a vertical direction and are more suitable for application in a stacked electronic device module.

In the present embodiment, the magnetic core 51 may further have air gaps provided, for example, between the first longitudinal middle column 514 and/or the second longitudinal middle column 515 and the lateral middle column 516, and/or between the first longitudinal middle column 514 and/or the second longitudinal middle column 515 and the first lateral side column 511, and/or between the first longitudinal middle column 514 and/or the second longitudinal middle column 515 and the second lateral side column 512.

Figure 3C:
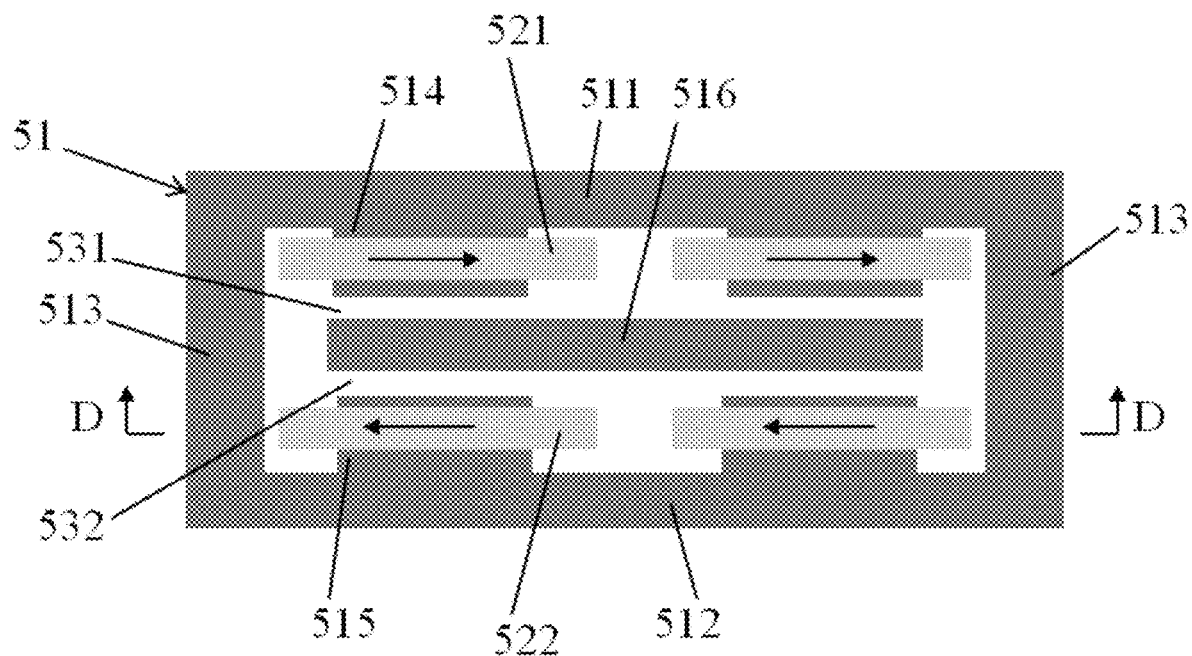
FIGS. 3C-3E show various variations on the basis of the embodiment of FIGS. 3A and 3B, illustrating structures of air gaps on different positions of longitudinal middle columns of a magnetic core of the multi-phase inverse coupling inductor.
Figure 3D:
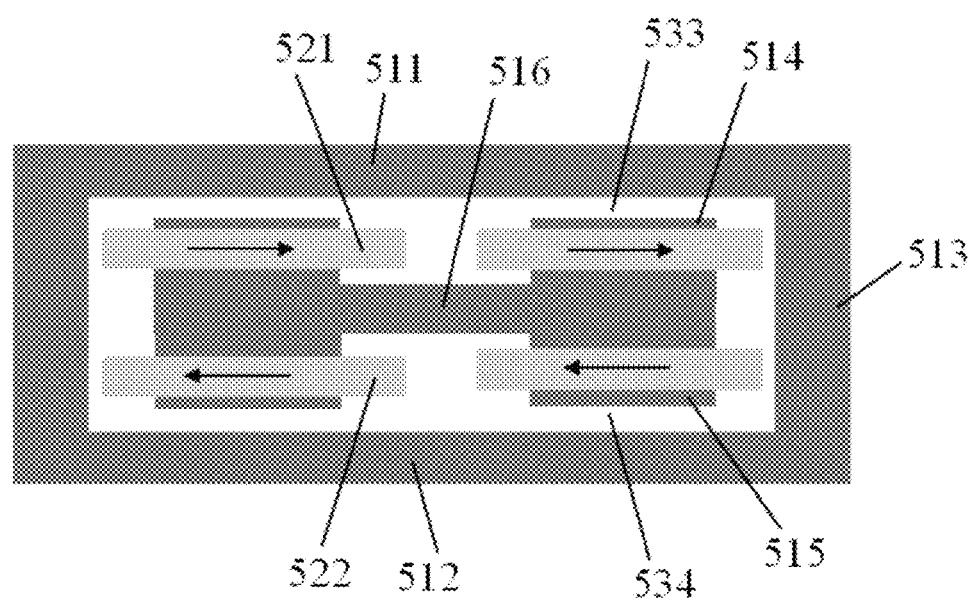
Figure 3E:
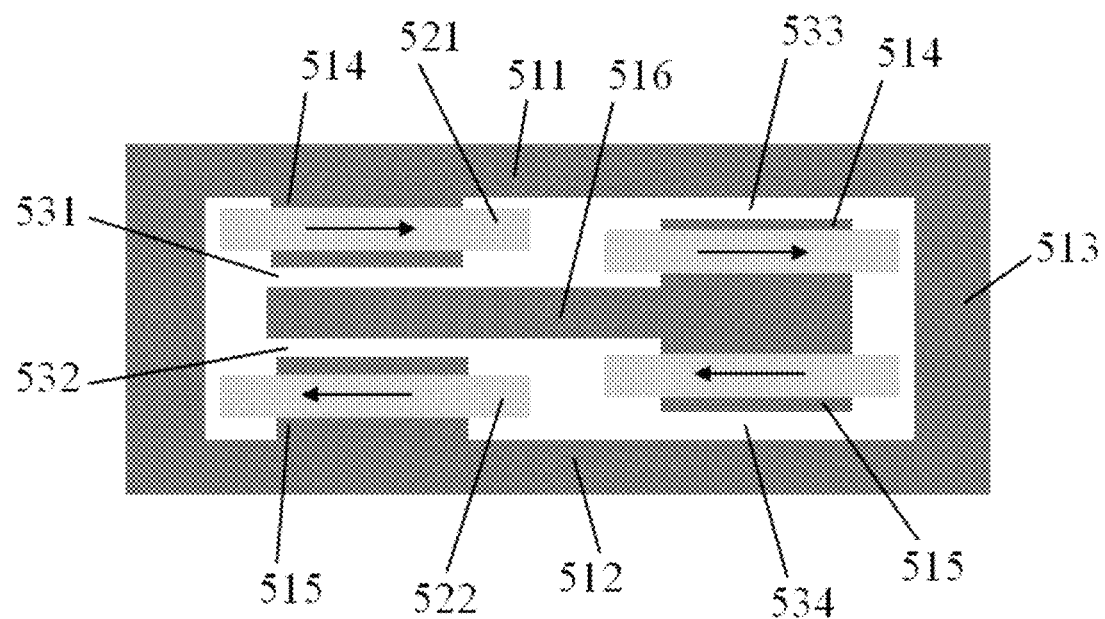
Figure 3F:
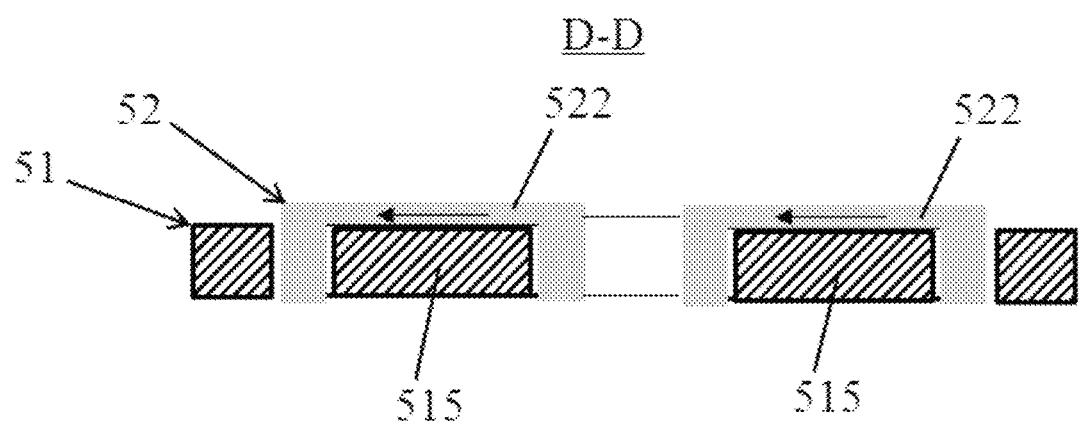
FIG. 3F is a sectional view along a D-D direction in FIG. 3C.

FIGS. 3C and 3F illustrate that air gaps are provided on the first longitudinal middle column 514 and the second longitudinal middle column 515 on the basis of FIGS. 3A and 3B. As shown in FIG. 3C, an air gap 531 is provided between the first longitudinal middle column 514 and the lateral middle column 516, and an air gap 532 is provided between the second longitudinal middle column 515 and the lateral middle column 516, to adjust inductance or saturation current capabilities of each phase. FIG. 3D is to provide an air gap 533 between the first longitudinal middle column 514 and the first lateral side column 511, and an air gap 534 between the second longitudinal middle column 515 and the second lateral side column 512. FIG. 3E is to provide the air gap 531 between one of the first longitudinal middle columns 514 and the lateral middle column 516, the air gap 532 between one of the second longitudinal middle column 515 and the lateral middle column 516, the air gap 533 between the other of first longitudinal middle column 514 and the first lateral side column 511, and the air gap 534 between the other of second longitudinal middle column 515 and the second lateral side column 512.

Figure 3G:
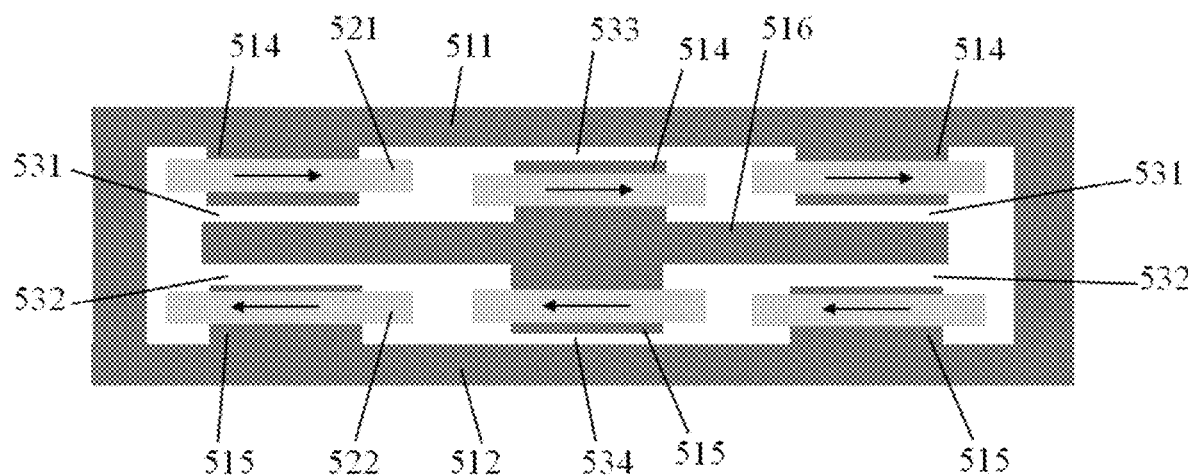
FIG. 3G shows a variation on the basis of the embodiment of FIG. 3E, illustrating a structure of a six-phase inverse coupling inductor.

FIG. 3F is a sectional view of FIG. 3C. As can be seen from FIG. 3F, in this embodiment, the second windings 522 are fitted onto the corresponding second longitudinal middle columns 515, below which terminals of the second windings 522 are led out, such that assembly of the second windings 522 and the magnetic core 51 can be relatively simple. Moreover, since the second windings 522 are vertically arranged, it also facilitates heat dissipation in a vertical direction. The assembling method of the first windings 521 is similar to that of the second windings 522, so the details are not described herein FIG. 3G is a variation on the basis of the embodiment of FIG. 3E, and illustrates a structure of a six-phase inverse coupling inductor. The six-phase inverse coupling inductor comprises three first longitudinal middle columns 514 and three second longitudinal middle columns 515, each of the first longitudinal middle columns 514 is fitted with one first windings 521, and each of the second longitudinal middle columns 515 is fitted with one second windings 522. Moreover, the air gaps 531 are provided between the two first longitudinal middle columns 514 on both sides and the lateral middle column 516, the air gaps 532 are provided between the two second longitudinal middle columns 515 on both sides and the lateral middle column 516, the air gap 533 is provided between the first longitudinal middle column 514 in the middle and the first lateral side column 511, and the air gap 534 is provided between the second longitudinal middle column 515 in the middle and the second lateral side column 512.

Figure 3H:
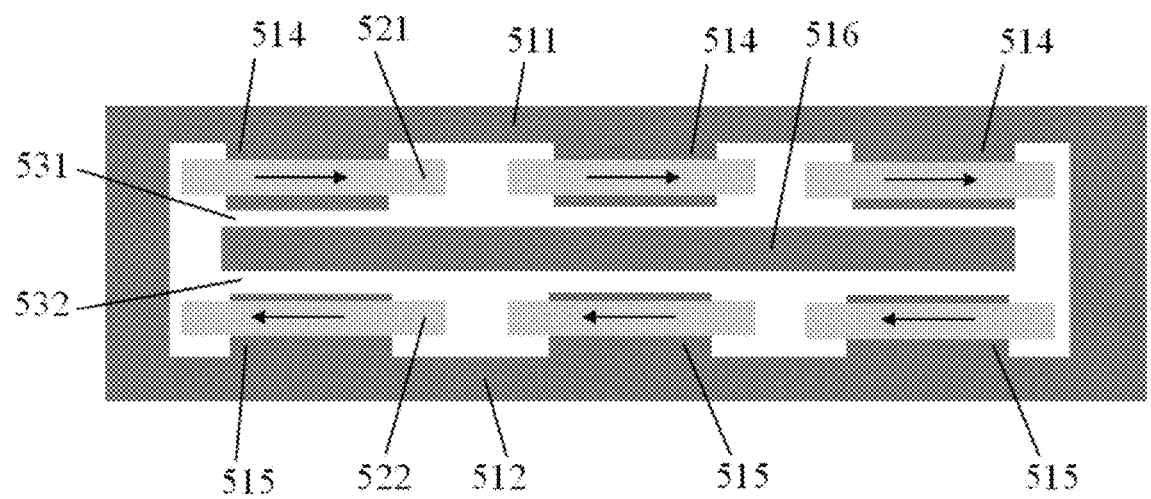
FIG. 3H shows a variation on the basis of the embodiment of FIG. 3C, illustrating a structure of a six-phase inverse coupling inductor.

FIG. 3H is a variation on the basis of the embodiment of FIG. 3C, and illustrates a structure of a six-phase inverse coupling inductor. The six-phase inverse coupling inductor comprises three first longitudinal middle columns 514 and three second longitudinal middle columns 515, each of the first longitudinal middle columns 514 is fitted with one first windings 521, and each of the second longitudinal middle columns 515 is fitted with one second windings 522. Moreover, the air gap 531 is provided between the three first longitudinal middle columns 514 and the lateral middle column 516, and the air gap 532 is provided between the three second longitudinal middle columns 515 and the lateral middle column 516.

The embodiment can flexibly adjust inductor parameters such as inductance and saturation current of the inductor, and also can be flexibly suitable for various manufacturing processes through the multiple ways of forming the air gaps 531 to 534. The embodiment also can select the way of forming the air gaps according to specific conditions of the manufacturing process, which facilitates improving manufacturability or reducing cost. In addition, the embodiment also can avoid the load or the device sensitive to radiation, and facilitate reducing EMI or interference by adjusting positions of the air gaps.

Figure 4A:
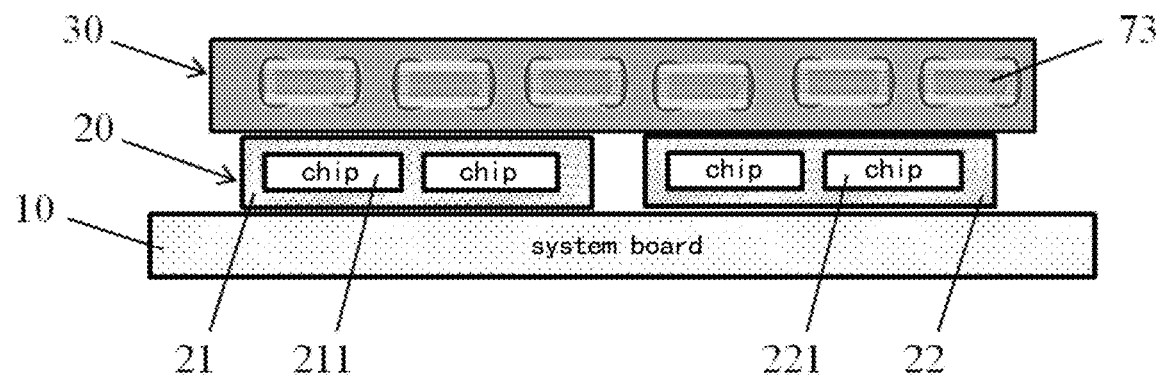
FIG. 4A is a structural diagram of a power supply system according to a third embodiment of the invention and illustrates a structure of the power supply system implemented taking a switching capacitor circuit shown in FIG. 11G as an example, wherein the bridge member of the power supply system is embedded with a plurality of capacitors.
Figure 4B:
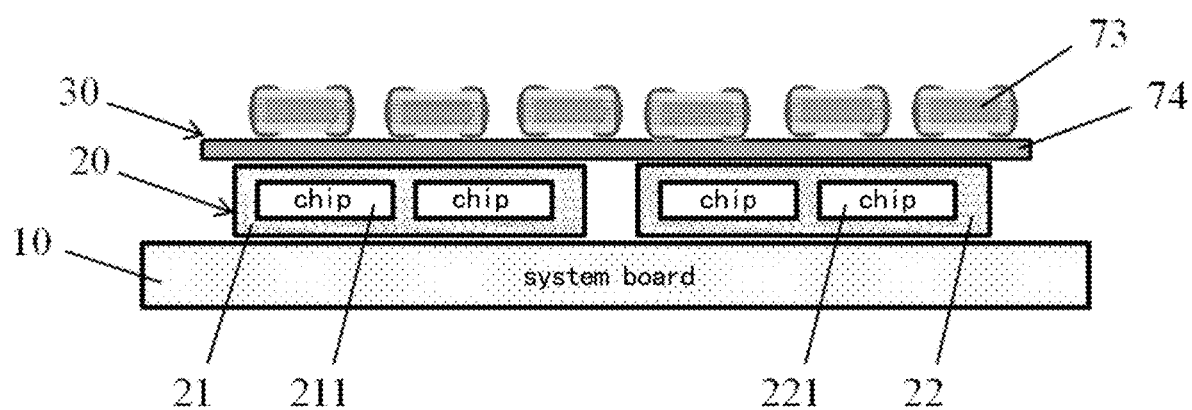
FIG. 4B shows a variation on the basis of the embodiment of FIG. 4A, wherein the capacitors are surface mounted on a bridge substrate to form the bridge member.
Figure 4C:
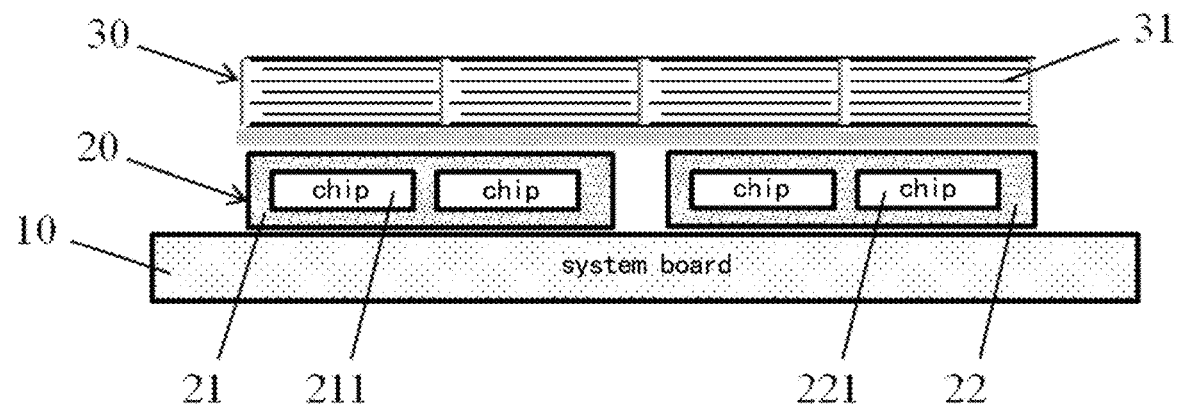
FIG. 4C shows another variation on the basis of the embodiment of FIG. 4A, wherein the capacitor adopts an integrated multi-layered capacitance plate as the bridge member.
Figure 11B:
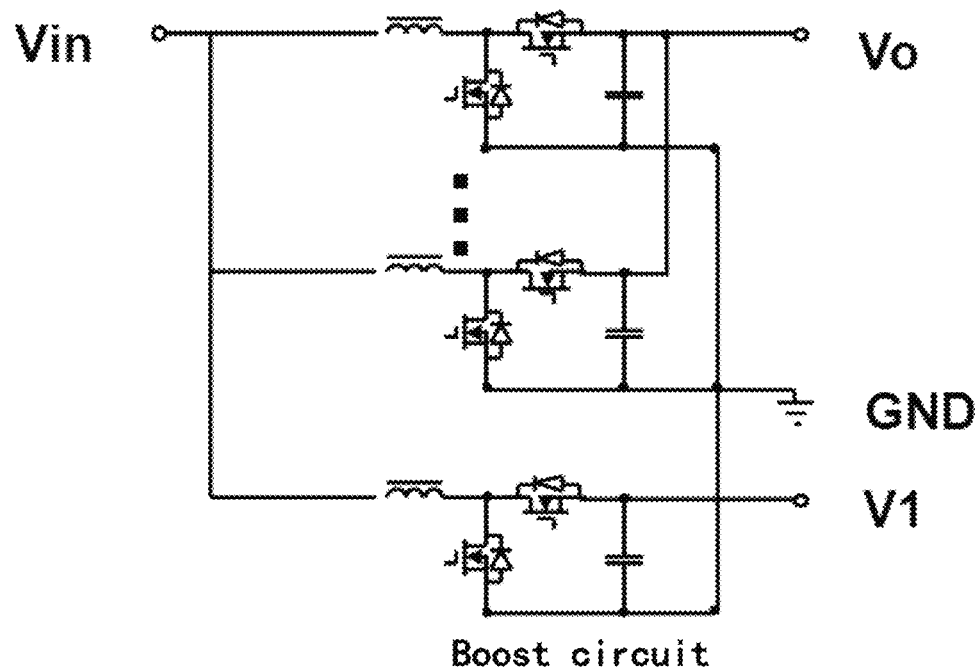
FIG. 11B illustrates a structure of a Boost circuit adapted to the invention.
Figure 11C:
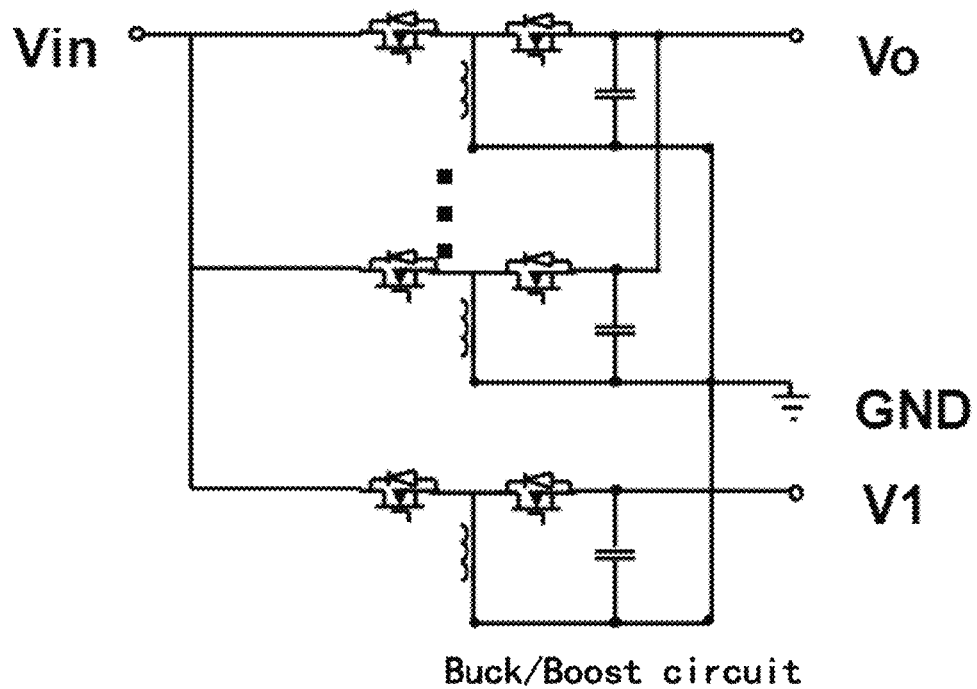
FIG. 11C illustrates a structure of a Buck/Boost circuit adapted to the invention.
Figure 11D:
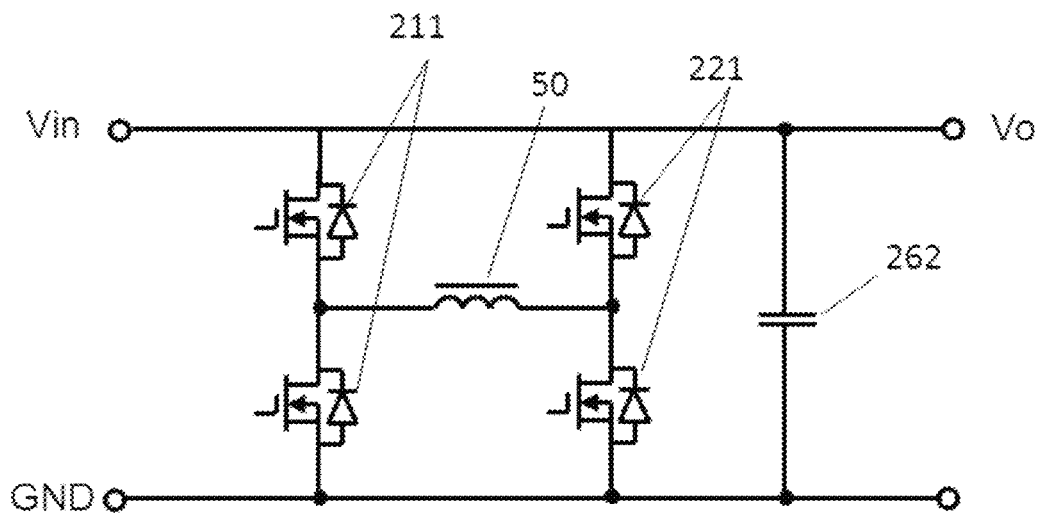
FIG. 11D illustrates a structure of a four switched buck-boost circuit adapted to the invention.
Figure 11E:
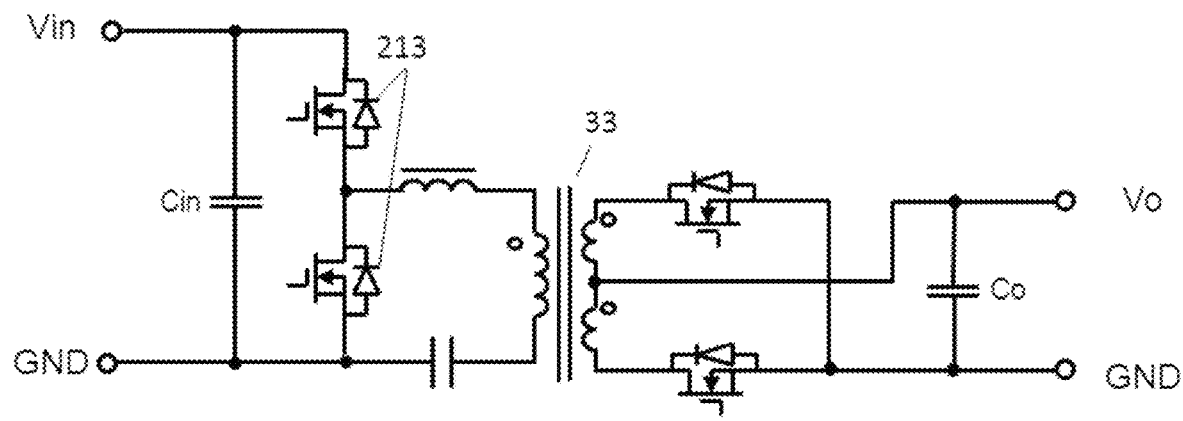
FIG. 11E illustrates a structure of a half-bridge LLC circuit adapted to the invention.
Figure 11F:
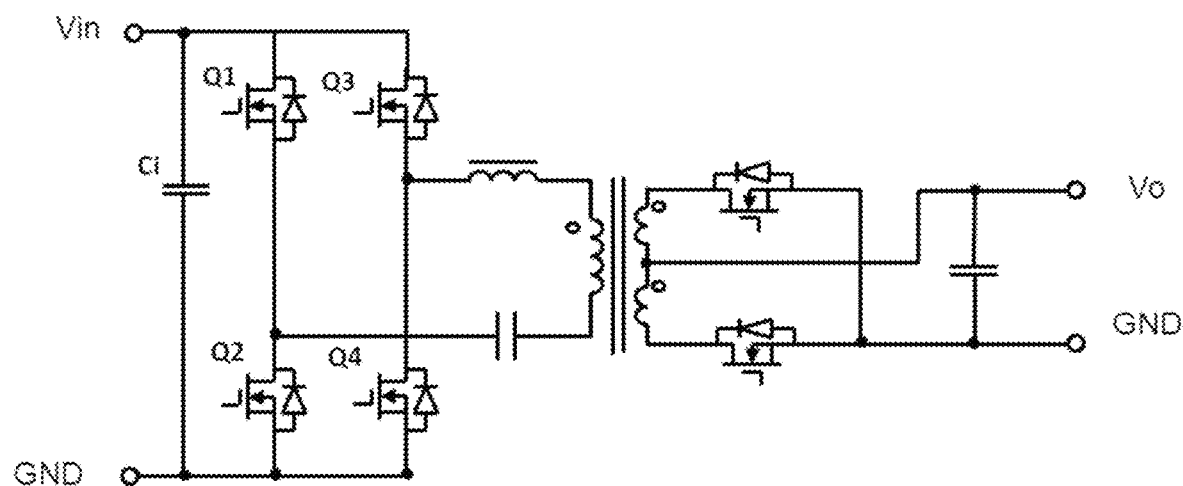
FIG. 11F illustrates a structure of a full-bridge LLC circuit adapted to the invention.
Figure 11G:
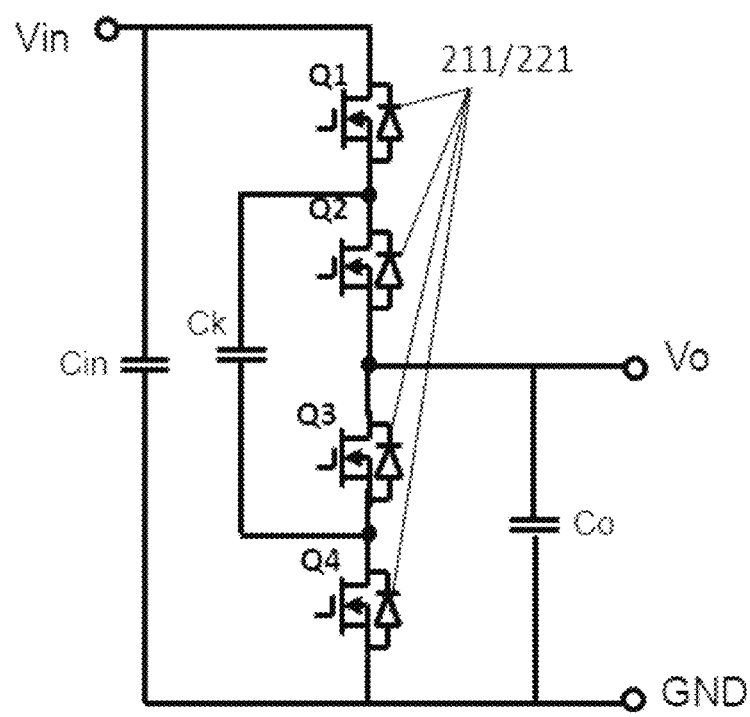
FIG. 11G illustrates a structure of a switching capacitor circuit adapted to the invention.

FIG. 4A is a structural diagram of a power supply system according to a third embodiment of the invention and illustrates a structure of the power supply system implemented taking a switching capacitor circuit shown in FIG. 11G for example. Of course, it should be understood that the specific switching capacitor topology also can be plural, but the invention is not limited thereto. FIG. 4A illustrates that the bridge member 30 may be embedded with a plurality of capacitors 73. For example, an input capacitor $C_{in}$, an output capacitor $C_o$ and a flying capacitor $C_k$ illustrated in FIG. 11G can be integrated into the bridge member 30. Of course, in some embodiment, these capacitors 73 also can be surface mounted onto one bridge substrate 74 to form the bridge member 30, as shown in FIG. 4B. FIG. 4C illustrates that the capacitor can use an integrated multi-layered capacitance plate 31 as the bridge member 30, and inside of the multi-layered capacitance plate 31 can be divided into a plurality of capacitors to realize corresponding functions of the capacitor in FIG. 4A. The bridge member 30 regarded as a capacitor can easily realize a capacitor with larger capacity, and facilitate improving transmission efficiency of the switching capacitor circuit. In some applications, one package 20 (such as the first package 21) in the embodiment of FIGS. 4A-4C as a first stage can supply power to the load through another package 20 (such as the second package 22) as a second stage, such as a buck circuit module.

Figure 5:
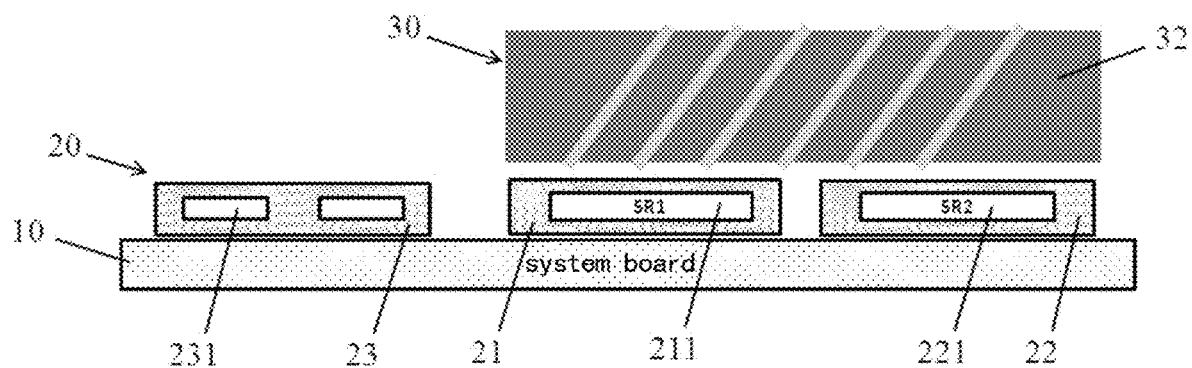
FIG. 5 is a structural diagram of a power supply system according to a fourth embodiment of the invention, wherein a transformer functions as the bridge member.

FIG. 5 is a structural diagram of a power supply system according to a fourth embodiment of the invention, wherein a transformer 32 functions as the bridge member 30, and the transformer 32, such as, may be a foil windings transformer. The two packages below the transformer 32 are the first package 21 and the second package 22, respectively, the first package 21 comprises a first secondary circuit, and the second package 22 comprises a second secondary circuit. Specifically, the first package 21 comprises a secondary rectifying circuit SR1 integrated into the chip 211, the second package 22 comprises a secondary rectifying circuit SR2 integrated into the chip 221, and SR1 and SR2 may function as secondary rectifying circuits of the transformer 32. The third package 23 on the system board 10 may comprise a primary circuit integrated into a chip 231 and may function as a primary circuit of the transformer 32.

Figure 6:
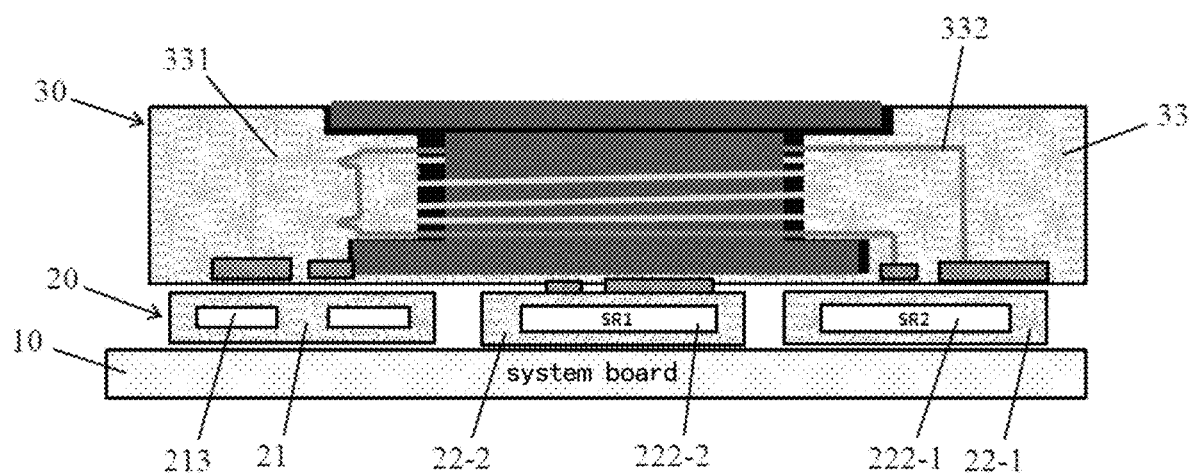
FIG. 6 shows a variation of the embodiment of FIG. 5, wherein a planar transformer functions as the bridge member.

In the embodiment of FIG. 5, the bridge member 30 crosses over packages of the two secondary rectifying circuits simultaneously, i.e., crosses over the first package 21 and the second package 22. In other embodiments, the bridge member 30 also can cross over a package of the primary circuit and the packages of the two secondary rectifying circuits simultaneously, i.e., crossing over the third package 23, the first package 21, and the second package 22, as shown in FIG. 6. In other embodiments, the first package 21 comprises a primary circuit, the second package 22 comprises a secondary circuit, and the bridge member 30 crosses over the first package 21 and the second package 22. In such a way, LLC power supply solution with different powers can be flexibly realized, both modularization and high efficiency can be considered, and application is flexible.

FIG. 6 is a variation of the embodiment of FIG. 5 and mainly differs from the embodiment of FIG. 5 in that a planar transformer 33 functions as the bridge member 30. A primary windings 331 is electrically connected to the package of the primary circuit (i.e., the first package 21), and a secondary windings 332 is electrically connected to the packages of the secondary rectifying circuits (i.e., the second packages 22-1 and 22-2). In the embodiment of FIG. 6, the two second packages 22-1 and 22-2 function as the packages of the secondary rectifying circuits. For example, the second package 22-1 having the secondary rectifying circuit SR1 and the second package 22-2 having the secondary rectifying circuit SR2 illustrated in the figure are electrically connected to the secondary windings 332 of the transformer 32 through wires. As compared to the foil windings transformer 32 shown in FIG. 5, the manufacturing of the planar transformer is easier, and leading out of the terminals is more convenient. The embodiments of FIGS. 5 and 6 are suitable for circuits including the transformer, such as LLC circuits. In such a way, LLC power supply solution with different powers can be flexibly realized, both modularization and high efficiency can be considered, and application is flexible.

Figure 7:
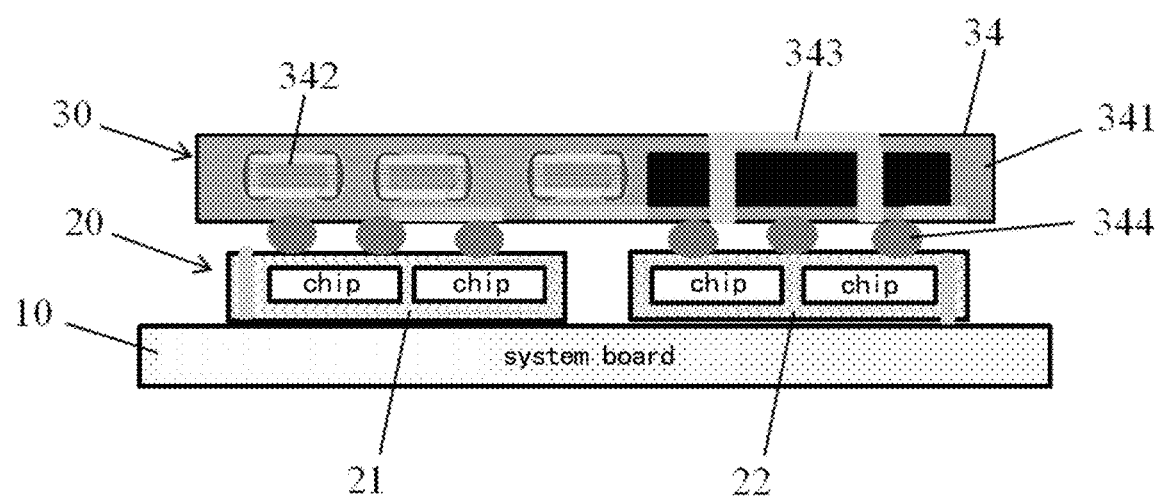
FIG. 7 is a structural diagram of a power supply system according to a fifth embodiment of the invention and illustrates that two packages can be different, and can be prefabricated with solder balls on the bridge member.

FIG. 7 is a structural diagram of a power supply system according to a fifth embodiment of the invention and illustrates that two packages 20 can be different. For example, one package 20 (such as the first package 21) may be a package of the switching capacitor circuit as the first stage or the second stage. For example, another package 20 (such as the second package 22) may be a package of the half-bridge circuit, such as forming a buck circuit as the second stage or the first stage. In addition, in the embodiment of FIG. 7, the bridge member 30 may be a bridge plate 34. For example, a capacitor 342 and an inductor 343 may be integrated within a substrate 341 using the way of an embedded process, or a molding process, the capacitor 342 may function as a capacitor for the switching capacitor circuit, and the inductor 343 may function as an output inductor of the half-bridge circuit. Such structure can complete power current transmission on the bridge member 30 between the two packages 20, system efficiency can be improved by providing trace with a smaller resistance in the bridge member 30, and the capacitor or inductor between the two stages cannot occupy resource of the customer board to reduce the occupation of resource of the system board, and facilitate improving customer application convenience and system efficiency. Moreover, the application is flexible and can satisfy various customer requirements.

FIG. 7 also illustrates that solder balls 344 can be pre-fabricated on the bridge member 30 to solder the bridge member 30 onto the packages 20 conveniently. Of course, it should be understood that solder balls 344 also can be pre-fabricated on the bridge member 30 in other embodiment of the invention, so as to be convenient for Surface Mount Technology (SMT) and reflow soldering.

Figure 8A:
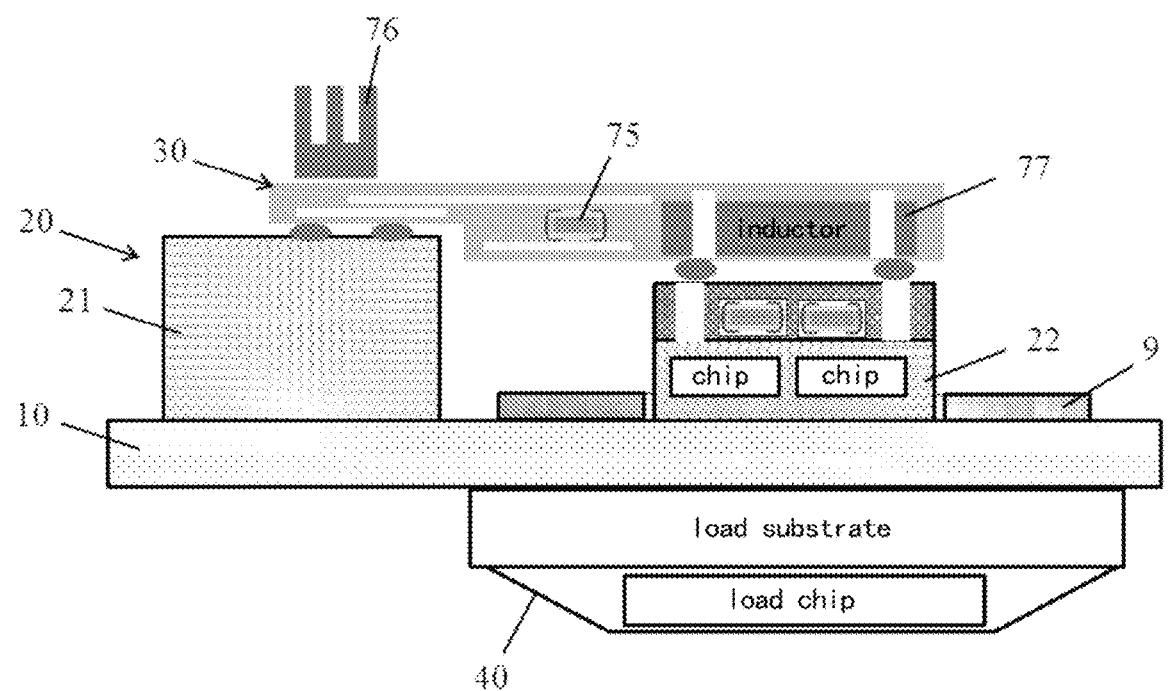
FIG. 8A is a structural diagram of a power supply system according to a sixth embodiment of the invention, wherein the power supply system is a two-stage power supply system, and a first stage (a first package) and a second stage (a second package) are arranged between the bridge member and the system board.
Figure 8B:
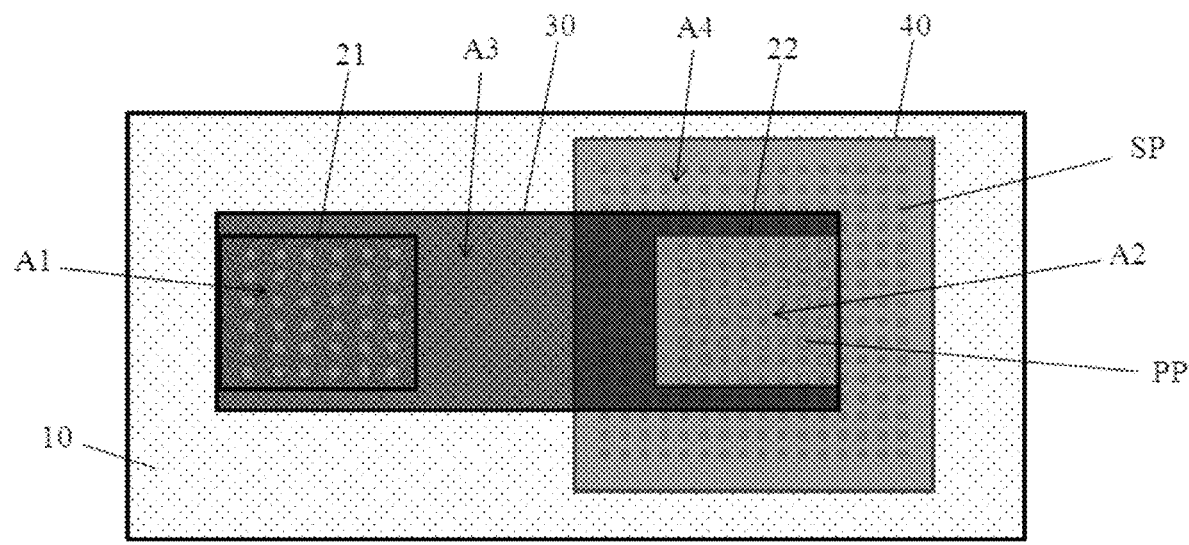
FIG. 8B is a bottom view of FIG. 8A, wherein projections of V terminals and GND terminals of the bridge member in a region A2 are overlapped with corresponding projections of V terminals and GND terminals of the load in the region A2.

FIG. 8A is a structural diagram of a power supply system according to a sixth embodiment of the invention. The power supply system may be a two-stage power supply system with the first package 21 as the first stage (for example, it can use an LLC circuit) and the second package 22 as the second stage (for example, it can use a buck circuit), and the first stage and the second stage are provided between the bridge member 30 and the system board 10. The load 40 is provided on the other side of the system board 10 opposite to the first stage and the second stage and forms a stacked structure. Referring to FIG. 8B, a contact surface of the load 40 and the system board 10 is provided with a power terminal PP in a center region and a signal terminal SP on a periphery of the power terminal PP, the power terminal PP is electrically connected to the second package 22, and the signal terminal SP is electrically connected to the system board 10. Current may be transmitted from the first package 21 (i.e., the first stage) to the load 40 via the bridge member 30, the second package 22 (i.e., the second stage), and the system board 10. More specifically, the second package 22, such as, is provided within a projection region A4 of the load 40 on the system board 10, i.e., a projection region A2 of the second package 22 on the system board 10 is located within the projection region A4 of the load 40 on the system board 10. Connection of the first package 21 and the system board 10, such as, is provided out of an enveloped projection region of the signal terminal SP of the load 40, i.e., a projection region A1 of the first package 21 on the system board 10 is located outside the projection region A4 of the load 40 on the system board 10. FIG. 8B also illustrates that V terminals and GND terminals of the bridge member 30 also can be provided within the projection region A2, and can be overlapped with a corresponding projection of the V terminals and the GND terminals of the load 40.

In the embodiments of FIGS. 8A and 8B, a power current directly "flies in" from the first stage (such as the first package 21) outside the projection region A4 of the load 40 to the second stage (such as the second package 22) via the bridge member 30, and the current is transmitted from the second stage to the system board 10, and then transmitted to the load 40, such that arrangement and leading out of the signal trace on the system board 10 can be convenient, and signal interference to the load is reduced.

In the embodiment of FIGS. 8A and 8B, it is also possible to reduce transfer impedance and improve efficiency by optimizing the bridge member 30. In addition, a connection surface of the bridge member 30 and the first stage (such as the first package 21) or the second stage (such as the second package 22) can be step-shaped and can be flexibly suitable for connection between the first stage and the second stage with different heights, so as to expand application range and adaptability.

In addition, please continue to refer to FIG. 8A, in some embodiment, a connector 76 also can be provided on the bridge member 30 for transmitting an external current to the first package 21 as the first stage. In particular, when an input is a high voltage, such as an input of 400V power supply, special design and safety certification can be avoided using such way when the high voltage is connected on the system board 10, design of the system board 10 can be simplified, and cost of the system board 10 can be reduced. Moreover, such an arrangement also facilitates mounting and fixing of the connector 76, and the pluggable connection of the opposing connector cooperated with the connector 76. Of course, the connector 76 also can be directly provided on the first package 21 to facilitate realizing a shorter current transmission path and simplify the structure of the bridge member 30.

Figure 8C:
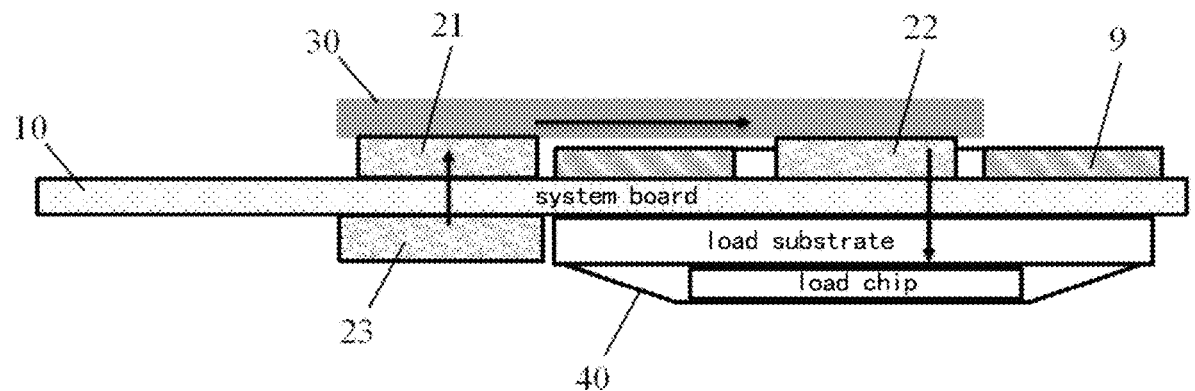
FIG. 8C is a structural diagram of a power supply system according to a seventh embodiment of the invention, wherein the power supply system further comprises a third package as a first stage that supplies power to the first package and the second package as a second stage, and the first stage and the second stage are provided on opposing sides of the system board, respectively.

FIG. 8C is a structural diagram of a power supply system according to a seventh embodiment of the invention. The power supply system further comprises a third package 23 as the first stage that supplies power to the first package 21 and the second package 22 as the second stage, and the first stage and the second stage are on opposite sides of the system board 10, respectively. FIG. 8C also illustrates that the bridge member 30 connects the two second stages (i.e., the first package 21 and the second package 22), and the load 40 is on the other side of the system board 10 opposite to the second package 22. That is, vertical projections of the load 40 and the at least one second stage on the system board are overlapped, i.e., the load 40 and the second package 22 are stacked. Moreover, the first stage (i.e., the third package 23) and the load 40 are provided on the same side of the system board 10. Of course, it should be understood that in other embodiment, vertical projections of the first stage and the at least one second stage on the system board 10 also can be overlapped. For example, in FIG. 8C, vertical projections of the third package 23, and the first package 21 on the system board 10 are overlapped.

As shown by an arrow direction in FIG. 8C, an output current of the first stage (such as the third package 23) is transmitted to one of the second stages (such as the first package 21) via the system board 10, and then transmitted to one or more second stages (such as the second package 22) via the bridge member 30, and the output current of the second stage is transmitted to the load 40 via the system board 10.

In addition, FIGS. 8A and 8C also illustrate a reinforcing plate 9 corresponding to the load (such as intelligent IC) 40. The reinforcing plate 9 can improve the reliability of connection between the load 40 and the system board 10, such as preventing deformation of the system board 10. The reinforcing plate 9 may be provided on the other side of the system board 10 opposite to the load 40, for example, one side of an upper surface of the system board 10 in the figure. Of course, a reinforcing plate 9 also may be provided on the same side of the load 40, for example, one side of a lower surface of the system board 10 in the figure. By implementing the embodiment of the invention, the bridge member 30 can cross over the reinforcing plate to facilitate the connection between the packages. The bridge member 30 can be electrically connected to the first package 21 or the second package 22 by an elastic terminal or the way of contact.

Figure 8D:
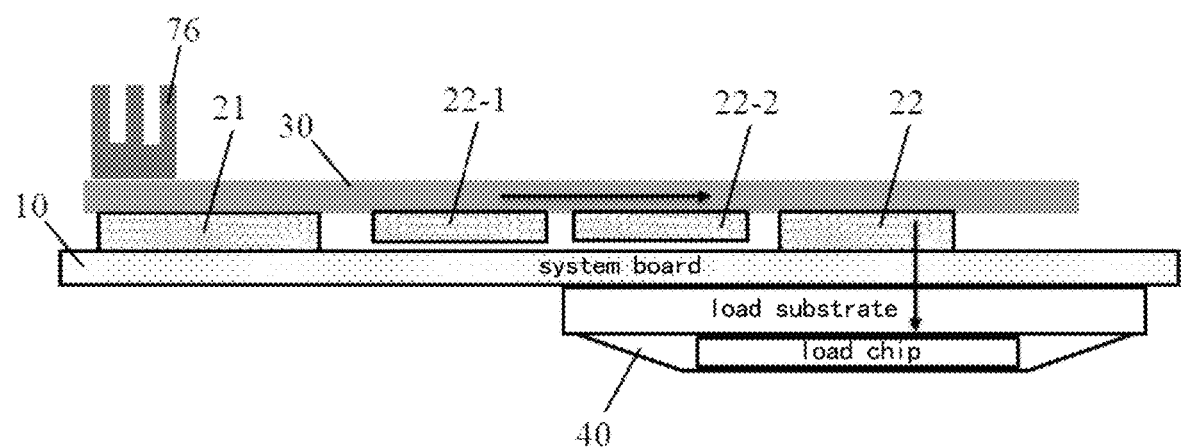
FIG. 8D shows a variation on the basis of the embodiment of FIG. 8C, wherein the first stage and the second stage are provided on the same side of the system board.

FIG. 8D is a variation on the basis of the embodiment of FIG. 8C, and mainly differs from FIG. 8C in that the first package 21 functions as the first stage, the second package 22 functions as the second stage, the first stage (such as the first package 21) and the second stage (such as the second package 22) are provided on the same side of the system board 10, and the bridge member 30 connects the first stage and the second stage. In the embodiment of FIG. 8D, the connector 76 also can be provided on the bridge member 30.

In the embodiment of FIGS. 8C and 8D, multiple second stages (such as second packages 22, 22-1, and 22-2) also can be connected in parallel to transmit current to the load 40. When space for the second stage on the system board 10 above the load 40 is limited, part of the second stages can be placed outside a projection region of the signal terminal of the load 40, or part of the second stages can be hung on the bridge member 30, and the packages of the second stages hung on the bridge member 30 can lead out terminal from a single surface. Moreover, multiple second stages with different electrical characteristics can be connected in parallel, such as the second stages with different working frequencies are connected in parallel. For example, the second stage (such as the second package 22 in FIG. 8D often has characteristics of a small volume and good dynamic performance) with a working frequency to be a high frequency (such as a frequency range is from 3 Mhz to 10 Mhz) can be close to the load 40, such as, stacked with the load 40, and the second stages (such as other second packages 22-1 and 22-2 in FIG. 8D often have characteristics of a large volume and high efficiency) with working frequencies to be low frequencies (such as a frequency range is from 500 Khz to 3 Mhz) are in a region away from the load 40, such that a power supply system with balanced efficiency and dynamic can be realized, and also space occupation of the system board 10, and interference can be reduced. Since the bridge member 30 is crossly connected to a plurality of packages (such as the first package 21, the second package 22-1, the second package 22-2, and the second package 22 in FIG. 8D), when the bridge member 30 crosses over a signal region of the system board 10, transmission of the power current flowing through the system board 10 (customer board) is avoided, occupation of the customer board is reduced, and interference to signal traces of the customer board is also reduced.

Figure 8E:
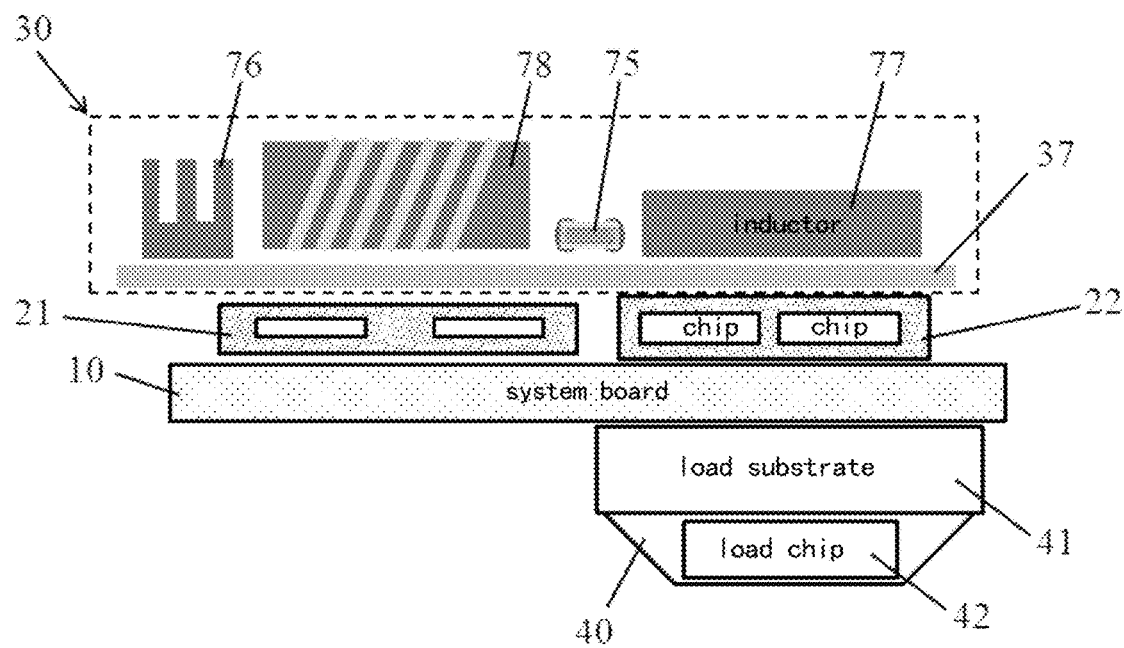
FIG. 8E shows a variation on the basis of the embodiment of FIG. 8A, wherein the bridge member is consisting of a substrate and a device on a surface of the substrate.

FIG. 8E is a variation on the basis of the embodiment of FIG. 8A, and differs from the embodiment of FIG. 8A in that the bridge member 30 comprises a substrate 37 and a device on a surface of the substrate 37. For example, in FIG. 8E, an output inductor 77 of the second stage (such as the buck circuit), a transformer 78 of the first stage (such as the LLC circuit), and a capacitor 75 between the first stage and the second stage are provided on a substrate 37 of the bridge member 30, and the connector 76 also can be provided on the substrate 37 to transmit an external power supply to the bridge member 30. Such a structure is more flexible and easier for manufacturing. In some embodiment, a controller (not shown) of the first stage or the second stage also can be provided on the substrate 37, such that occupation of resource of the system board 10 can be further reduced.

Figure 9A:
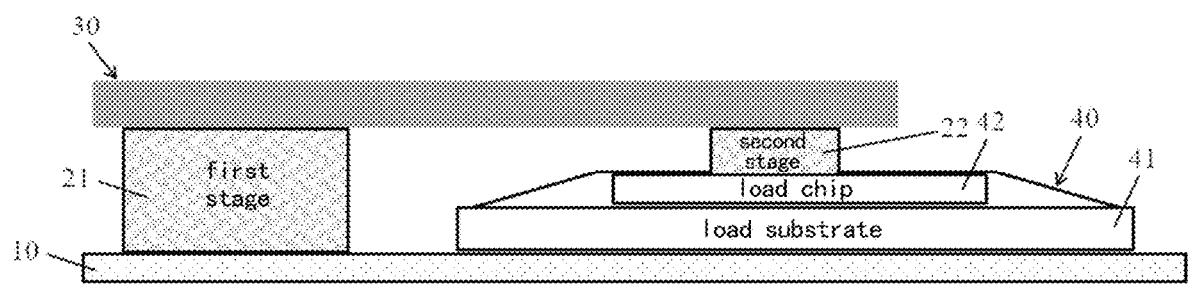
FIG. 9A is a structural diagram of a power supply system according to an eighth embodiment of the invention, wherein the power supply system is a two-stage power supply system, with the second package as a second stage forming a stacked structure with the load and being provided on a load chip of the load.

FIG. 9A is a structural diagram of a power supply system according to an eighth embodiment of the invention. The power supply system is a two-stage power supply system, the first package 21 functions as a first stage, the second package 22 functions as a second stage, and the first stage and the second stage are provided between the system board 10 and the bridge member 30. Moreover, the second package 22 as the second stage forms a stacked structure with the load 40 and is provided on a load chip 42 of the load 40. For example, terminals may be provided on upper and lower surfaces of the load chip 42 of the load 40, upper terminals are electrically connected to the second package 22 as the second stage, and the connection way can be elastically connected or soldered. Such an arrangement can supply power to the load 40 completely without passing through the system board 10, and a space of the system board 10 can be better released for transmission of signal traces and arrangement of other functional devices. In addition, the first stage (such as, the first package 21) and the second stage (such as, the second package 22), the bridge member 30 and the load 40 in such structure are provided on the same side of the system board 10, which also facilitate surface mounting and soldering.

Figure 9B:
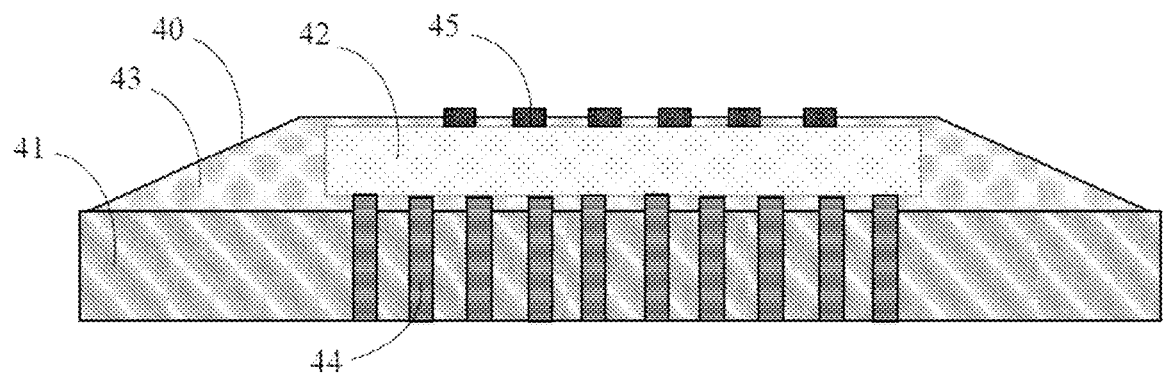
FIG. 9B is a schematic diagram of a load adapted to the embodiment of FIG. 9A.

FIG. 9B is a schematic diagram of a load adapted to the embodiment of FIG. 9A. In this embodiment, a signal terminal 44 of the load 40 is led out from one side towards the system board 10, and a power terminal 45 of the load 40 is led out from one side opposite the system board 10. The bridge member 30 is located on one side of the load 40 opposite the system board 10, and the package 22 is located on one side of the load 40 opposite the system board 10. Specifically, the load 40 comprises a load substrate 41, a load chip 42 (such as a bare die), and an insulated encapsulant 43, the load chip 42 is embedded in the insulated encapsulant 43, and the load substrate 41 is located between the insulated encapsulant 43 and the system board 10. The signal terminal 44 of the load chip 42 is led out from one side of the load substrate 41 towards the system board 10, and the power terminal 45 of the load 40 is led out from one side of the insulated encapsulant 43 opposite the system board 10. The power terminal 45 and the signal terminal 44 of the load 40 are led out from different sides of the load 40, such that power traces and signal traces can be better separated to better facilitate reducing interference of the power traces of the load 40 to the signal traces, and also better facilitate leading out and arrangement of the signal traces to be suitable for different application scenarios. The package 22 vertically stacked above the power terminal of the load 40 can supply power to the load 40 completely without passing through the system board 10, and better facilitate the simplifying design of the system board 10.

Figure 10A:
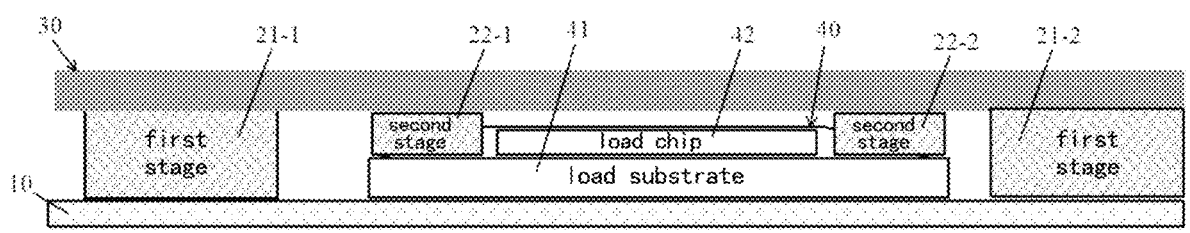
FIG. 10A is a structural diagram of a power supply system according to a ninth embodiment of the invention, wherein the power supply system is a two-stage power supply system, the second package as a second stage is stacked on the load substrate of the load.

FIG. 10A is a structural diagram of a power supply system according to a ninth embodiment of the invention. The power supply system is a two-stage power supply system, the second packages 21-1 and 21-2 function as the first stages and the second packages 22-1 and 22-2 function as the second stages. The embodiment of FIG. 10A mainly differs from the embodiment of FIG. 9A in that the second packages 22-1 and 22-2 as the second stages are stacked on the load substrate 41 of the load 40, such as positions beside the load chip 42 of the load 40, such that the load chip 42 may not lead out terminals from upper and lower surfaces to simplify design and structure of the load chip 42. Moreover, a space above the load chip 42 can be remained, i.e., a window 36 can be reserved at a position of the bridge member 30 corresponding to the load chip 42 for heat dissipation, as shown in FIG. 10C.

Figure 10B:
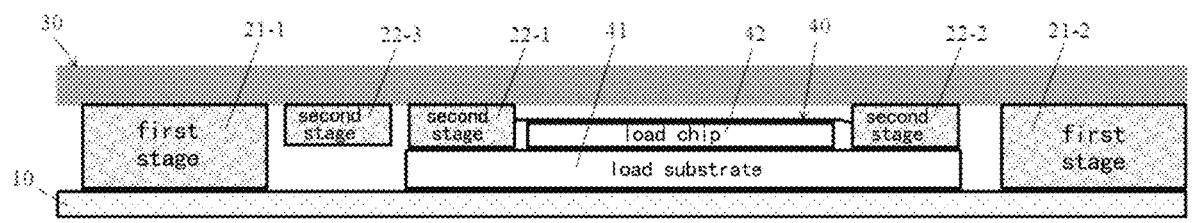
FIG. 10B shows a variation on the basis of the embodiment of FIG. 10A, wherein the bridge member is also provided with another second stage (the second package).
Figure 10C:
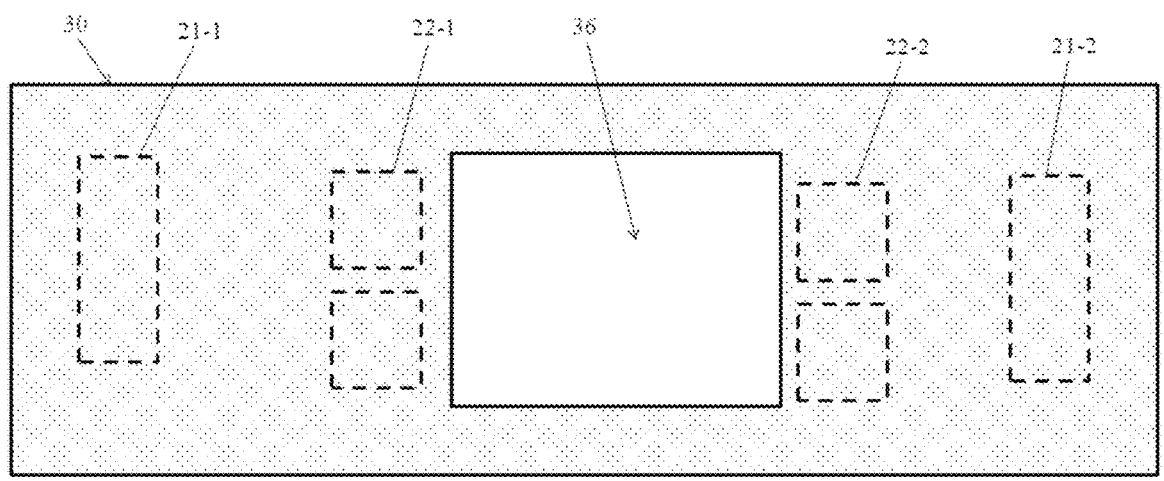
FIG. 10C is a top view of FIG. 10A, wherein the bridge member is reserved with a window at a position above the load chip for heat dissipation.

FIG. 10B is a variation on the basis of the embodiment of FIG. 10A, and mainly differs from the embodiment of FIG. 10A in that the bridge member is also provided with another second stage (such as the second package 22-3), and the second package 22-3 is hung on a lower surface of the bridge member 30, such that it may facilitate improving power of the power supply system and reducing occupation of the system board 10. Of course, it should be understood that the power supply system in FIG. 9A also can be provided with more second stages (such as the second package 22) on the bridge member 30.

It should be noted that the first package and the second package in the previous embodiments can be soldered onto the system board 10, and then soldered to the bridge member 30. That is, the first package, the second package and the bridge member 30 can function as separate modules to be supplied to the customer. For example, the first package and the second package can function as standard components. In order to meet various customer requirements, the bridge member 30 can be customized, and multiple power supply solutions are formed through combinations with standard first and second packages, which have overall advantages in aspects of larger flexibility, efficiency, and cost.

FIGS. 11A-11G illustrate several circuit structures, wherein FIG. 11A illustrates a buck circuit, FIG. 11B illustrates a Boost circuit, FIG. 11C illustrates a Buck/Boost circuit, FIG. 11D illustrates a four switched buck-boost circuit, FIG. 11E illustrates a half-bridge LLC circuit, FIG. 11F illustrates a full-bridge LLC circuit and FIG. 11G illustrates a switching capacitor circuit. All of these circuit structures may be suitable for the power supply system of the invention. In FIGS. 11A-11G, $C_{in}$ represents an input capacitor, $C_o$ represents an output capacitor, $V_{in}$ represents an input positive terminal of the circuit, GND represents an input negative terminal (i.e., connecting to the ground) of the circuit, $V_o$ represents an output positive terminal of the circuit, SW represents an intermediate node of the half-bridge circuit, and $V_{in}$ represents an output positive terminal of the half-bridge circuit having different output voltage from $V_o$. However, it should be understood that the power supply system of the invention is also not limited to these circuits, and also can be adapted to other suitable circuits. In other words, the embodiments of the invention also can be applied to other circuit topologies, such as, including but not limited to Cuk or flyback circuits. Those skilled in the art may obtain an improvement of similar performances and effects by referring to similar design and analysis.

Although the invention has been described with reference to several typical embodiments, it should be understood that the terms used are explanatory and exemplary, not limiting terms. Since the invention can be implemented in various forms without departing from the spirit or essence of the invention, it should be understood that the above embodiments are not limited to any foregoing details but shall be explained extensively within the spirit and range defined by the appended claims, so any changes and modifications falling into the claims or equivalent ranges shall be covered by the appended claims.

What is claimed is:

1. A power supply system, comprising:
a system board electrically connected to a load;
a first package and a second package provided on an upper side of the system board;
a bridge member provided on upper sides of the first package and the second package, comprising a passive element and used for power coupling between the first package and the second package; and
a connector electrically connected to the bridge member for transmitting an external current to the first package,
wherein vertical projections of the first package and the second package on the system board are both overlapped with a vertical projection of the bridge member on the system board, the first package comprises one or more switching devices encapsulated in the first package, and the second package comprises one or more switching devices encapsulated in the second package, terminals on upper surfaces of the first package and the second package are electrically connected to the bridge member, and terminals on lower surfaces thereof are electrically connected to the system board.

2. The power supply system according to claim 1, further comprising a reinforcing plate corresponding to the load.

3. The power supply system according to claim 1, wherein the vertical projection of the second package on the system board is overlapped with the vertical projection of the load on the system board.

4. The power supply system according to claim 3, wherein the first package and the second package are provided on an upper surface of the system board, and the load is provided on a lower surface of the system board.

5. The power supply system according to claim 4, wherein a surface of the load that contacts with the system board is provided with a power terminal in a center region and a signal terminal on a periphery of the power terminal;
the power terminal is electrically connected to the second package, and the signal terminal is electrically connected to the system board;
current is transmitted from the first package to the load via the bridge member, the second package, and the system board.

6. The power supply system according to claim 4, further comprising a third package provided on a lower surface of the system board, wherein a vertical projection of the third package on the system board is overlapped with a vertical projection of the first package on the system board;
the third package supplies power to the first package and the second package, the first package supplies power to the load through the bridge member, the second package and the system board, and the second package supplies power to the load through the system board; or the first package and the second package supply power to the third package, and the third package supplies power to the load.

7. The power supply system according to claim 1, wherein the first package and the load are provided on an upper surface of the system board, the second package is stacked on an upper side of the load, and the bridge member is stacked on upper sides of the first package and the second package;
wherein the load comprises a load substrate stacked on the upper surface of the system board and a load chip stacked on an upper side of the load substrate.

8. The power supply system according to claim 7, wherein the second package is stacked on an upper side of the load chip;
an upper surface of the load chip is provided with a power terminal electrically connected to the second package, and a lower surface of the load substrate is provided with a signal terminal electrically connected to the system board.

9. The power supply system according to claim 7, wherein the second package is stacked on an upper surface of the load substrate;
the upper surface of the load substrate is provided with a power terminal electrically connected to the second package, and a lower surface of the load substrate is provided with a signal terminal electrically connected to the system board.

10. The power supply system according to claim 1, wherein the load comprises a load chip, an insulated encapsulant, and a load substrate, the load chip is embedded in the insulated encapsulant, and the load substrate is located between the insulated encapsulant and the system board;
a signal terminal of the load is led out from one side of the load substrate towards the system board, and a power terminal of the load is led out from one side of the insulated encapsulant opposite the system board.

11. The power supply system according to claim 1, wherein a number of the second package is plural, and at least one of the second packages is hung on a lower surface of the bridge member;
the plurality of the second packages are connected in parallel, and supply power to the load;
wherein the second package with a working frequency to be a low frequency is close to the load, and the second package with a working frequency to be a high frequency is away from the load.

12. The power supply system according to claim 1, wherein the bridge member comprises a multi-layered capacitance plate.

13. The power supply system according to claim 1, wherein a heat sink is stacked above the bridge member; and
wherein a capacitor is provided between the first package and the second package.

14. The power supply system according to claim 1, wherein the bridge member comprises a transformer;
the first package comprises a first secondary circuit, the second package comprises a second secondary circuit, and the transformer is electrically connected to the first package and the second package,
or the first package comprises a primary circuit, the second package comprises a secondary circuit, and the transformer crosses over the first package and the second package;
wherein the transformer is a foil windings transformer or a planar transformer.

15. The power supply system according to claim 1, wherein the first package comprises a switching capacitor circuit, and the second package comprises a half-bridge circuit;

the bridge member comprises a capacitor functioning as a capacitor of the switching capacitor circuit, and an inductor functioning as an output inductor of the half-bridge circuit.

16. The power supply system according to claim 1, wherein the bridge member comprises a bridge substrate, and at least one component provided on or embedded in the bridge substrate;
the at least one component comprises at least one of an inductor, a capacitor, a transformer, and a controller;
the bridge member is provided with a pre-fabricated solder ball.

17. The power supply system according to claim 1, wherein the switching devices in the first package form at least one half-bridge circuit, and the switching devices in the second package form at least one half-bridge circuit;
the bridge member comprises a multi-phase intergrated inductor including a magnetic core and a plurality of windings, and intermediate nodes of the half-bridge circuit of the first package and the half-bridge circuit of the second package are respectively electrically connected to the corresponding windings.

18. The power supply system according to claim 1, wherein the first package, the second package, and the load are positioned on an upper surface of the system board;
the first package and the second package are arranged along a lateral direction or a longitudinal direction, and an entirety of the first package and the second package is arranged with the load along the lateral direction.

19. A power supply module, is configured to be applied to a power supply system, the power supply system further comprises a load and a system board electrically connected to the load, wherein the power supply module supply power to the load through the system board, the power supply module comprising:
a first package and a second package; and
a bridge member provided on upper sides of the first package and the second package, comprising a passive element and used for power coupling between the first package and the second package; and
a connector electrically connected to the bridge member for transmitting an external current to the first package,
wherein the first package and the second package are provided on an upper side of the system board, wherein vertical projections of the first package and the second package on the system board are both overlapped with a vertical projection of the bridge member on the system board, the first package comprises one or more switching devices encapsulated in the first package, and the second package comprises one or more switching devices encapsulated in the second package, terminals on upper surfaces of the first package and the second package are electrically connected to the bridge member, and terminals on lower surfaces thereof are electrically connected to the system board.

20. The power supply module according to claim 19, the first package, the second package, and the load are positioned on an upper surface of the system board;
the first package and the second package are arranged along a lateral direction or a longitudinal direction, and an entirety of the first package and the second package is arranged with the load along the lateral direction.

21. The power supply module according to claim 19, wherein the first package and the second package are provided on an upper surface of the system board, and the load is provided on a lower surface of the system board,
wherein the vertical projection of the second package on the system board is overlapped with the vertical projection of the load on the system board.

22. The power supply module according to claim 21, further comprising a third package provided on a lower surface of the system board, wherein a vertical projection of the third package on the system board is overlapped with a vertical projection of the first package on the system board;
the third package supplies power to the first package and the second package, the first package supplies power to the load through the bridge member, the second package and the system board, and the second package supplies power to the load through the system board; or the first package and the second package supply power to the third package, and the third package supplies power to the load.

23. The power supply module according to claim 19, wherein the first package and the load are provided on an upper surface of the system board, the second package is stacked on an upper side of the load, and the bridge member is stacked on upper sides of the first package and the second package;
wherein the load comprises a load substrate stacked on the upper surface of the system board and a load chip stacked on an upper side of the load substrate.

24. The power supply module according to claim 23, wherein the second package is stacked on an upper side of the load chip;
an upper surface of the load chip is provided with a power terminal electrically connected to the second package, and a lower surface of the load substrate is provided with a signal terminal electrically connected to the system board.

25. The power supply module according to claim 23, wherein the second package is stacked on an upper surface of the load substrate;
the upper surface of the load substrate is provided with a power terminal electrically connected to the second package, and a lower surface of the load substrate is provided with a signal terminal electrically connected to the system board.

26. The power supply module according to claim 19, wherein a number of the second package is plural, and at least one of the second packages is hung on a lower surface of the bridge member;
the plurality of the second packages are connected in parallel, and supply power to the load;
wherein the second package with a working frequency to be a low frequency is close to the load, and the second package with a working frequency to be a high frequency is away from the load.

* * * * *